US006477285B1

(12) United States Patent
Shanley

(10) Patent No.: US 6,477,285 B1
(45) Date of Patent: Nov. 5, 2002

(54) INTEGRATED CIRCUITS WITH OPTICAL SIGNAL PROPAGATION

(75) Inventor: Charles W. Shanley, North Barrington, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/607,744

(22) Filed: Jun. 30, 2000

(51) Int. Cl.[7] ................................................. G02B 6/12
(52) U.S. Cl. ............................ 385/14; 385/24; 385/42; 357/19; 372/50
(58) Field of Search ............................ 385/14, 24, 42, 385/50, 37, 147; 357/19, 30, 74; 372/50

(56) References Cited

U.S. PATENT DOCUMENTS

| | | |
|---|---|---|
| 3,766,370 A | 10/1973 | Walther |
| 3,802,967 A | 4/1974 | Ladany et al. |
| 4,006,989 A | 2/1977 | Andringa |
| 4,174,422 A | 11/1979 | Matthews et al. |
| 4,284,329 A | 8/1981 | Smith et al. |
| 4,404,265 A | 9/1983 | Manasevit |
| 4,482,906 A | 11/1984 | Hovel et al. |
| 4,484,332 A | 11/1984 | Hawrylo |
| 4,523,211 A | 6/1985 | Morimoto et al. |
| 4,661,176 A | 4/1987 | Manasevit |
| 4,777,613 A | 10/1988 | Shahan et al. |

(List continued on next page.)

FOREIGN PATENT DOCUMENTS

| | | |
|---|---|---|
| EP | 0 250 171 | 12/1987 |
| EP | 0 342 937 | 11/1989 |
| EP | 0 455 526 | 6/1991 |
| EP | 0 514 018 | 11/1992 |
| EP | 0 602 568 | 6/1994 |
| EP | 0 607 435 | 7/1994 |
| EP | 0 999 600 | 5/2000 |
| EP | 1 001 468 | 5/2000 |
| GB | 1 319 311 | 6/1970 |
| GB | 2 335 792 | 9/1999 |

(List continued on next page.)

OTHER PUBLICATIONS

Nakagawara et al., Effects of Buffer Layers in Epitaxial Growth of $SrTiO_3$ Thin Film on Si(100), *J. Appl. Phys.*, 78 (12), Dec. 15, 1995, pp. 7226–7230.

Suzuki et al., "A Proposal of Epitaxial Oxide Thin Film Structures For Future Oxide Electronics," *Materials Science and Engineering* B41, (1996), pp. 166–173.

W. F. Egelhoff et al., "Optimizing GMR Spin Valves: The Outlook for Improved Properties", 1998 *Int'l Non Volatile Memory Technology Conference*, pp. 34–37.

Wang et al., "Processing and Performance of Piezoelectric Films", Univ. Of MD, Wilcoxon Research Col, and Motorola Labs, May 11, 2000.

(List continued on next page.)

*Primary Examiner*—Phan T. H. Palmer
(74) *Attorney, Agent, or Firm*—Oblon, Spivak, McClelland, Maier & Neustadt, P.C.

(57) ABSTRACT

An integrated circuit is presented in which optical signal propagation replaces or supplements conventional electrical signal propagation. Optical lasers, waveguides, beam splitters, and photodetectors are fabricated on top of or below conventional electrical semiconductor circuits to propagate data, clock, and control signals. Such optical signal propagation is generally more rapid than electrical signal propagation, and can free conventional electrical semiconductor circuit area by eliminating at least some conventional data busses and global clock and control wiring. Furthermore, optical clock signal propagation substantially eliminates clock skewing problems and reduces power consumption by significantly eliminating clock signal re-buffering.

32 Claims, 13 Drawing Sheets

U.S. PATENT DOCUMENTS

| | | |
|---|---|---|
| 4,793,872 A | 12/1988 | Meunier et al. |
| 4,802,182 A | 1/1989 | Thorton et al. ............... 372/50 |
| 4,815,084 A | 3/1989 | Scifres et al. |
| 4,846,926 A | 7/1989 | Kay et al. |
| 4,855,249 A | 8/1989 | Akasaki et al. |
| 4,876,219 A | 10/1989 | Eshita et al. |
| 4,882,300 A | 11/1989 | Inoue et al. |
| 4,891,091 A | 1/1990 | Shastry |
| 4,896,194 A | 1/1990 | Suzuki |
| 4,912,087 A | 3/1990 | Aslam et al. |
| 4,928,154 A | 5/1990 | Umeno et al. |
| 4,963,508 A | 10/1990 | Umeno et al. |
| 4,963,949 A | 10/1990 | Wanlass et al. |
| 4,999,842 A | 3/1991 | Huang et al. |
| 5,051,790 A * | 9/1991 | Hammer ..................... 357/19 |
| 5,060,031 A | 10/1991 | Abrokwah, et al.. |
| 5,063,166 A | 11/1991 | Mooney et al. |
| 5,081,062 A | 1/1992 | Vasudev et al. |
| 5,116,461 A | 5/1992 | Lebby et al. |
| 5,127,067 A | 6/1992 | Delcoco et al. |
| 5,141,894 A | 8/1992 | Bisaro et al. |
| 5,144,409 A | 9/1992 | Ma |
| 5,155,658 A | 10/1992 | Inam et al. |
| 5,159,413 A | 10/1992 | Calviello et al. |
| 5,173,474 A | 12/1992 | Connell et al. |
| 5,221,367 A | 6/1993 | Chisholm et al. |
| 5,225,031 A | 7/1993 | McKee et al. |
| 5,248,564 A | 9/1993 | Ramesh |
| 5,260,394 A | 11/1993 | Tazaki et al. |
| 5,270,298 A | 12/1993 | Ramesh |
| 5,286,985 A | 2/1994 | Taddiken |
| 5,293,050 A | 3/1994 | Chapple-Sokol et al. |
| 5,310,707 A | 5/1994 | Oishi et al. |
| 5,326,721 A | 7/1994 | Summerfelt |
| 5,356,831 A | 10/1994 | Calviello et al. |
| 5,358,925 A | 10/1994 | Neville Connell et al. |
| 5,391,515 A | 2/1995 | Kao et al. |
| 5,393,352 A | 2/1995 | Summerfelt |
| 5,404,581 A | 4/1995 | Honjo |
| 5,418,216 A | 5/1995 | Fork |
| 5,418,389 A | 5/1995 | Watanabe |
| 5,436,759 A | 7/1995 | Dijaii et al. |
| 5,442,191 A | 8/1995 | Ma |
| 5,444,016 A | 8/1995 | Abrokwah et al. |
| 5,450,812 A | 9/1995 | McKee et al. |
| 5,478,653 A | 12/1995 | Guenzer |
| 5,480,829 A | 1/1996 | Abrokwah et al. |
| 5,482,003 A | 1/1996 | McKee et al. |
| 5,514,484 A | 5/1996 | Nashimoto |
| 5,528,414 A | 6/1996 | Oakley ..................... 359/257 |
| 5,556,463 A | 9/1996 | Guenzer |
| 5,576,879 A | 11/1996 | Nashimoto ................. 359/248 |
| 5,588,995 A | 12/1996 | Sheldon |
| 5,606,184 A | 2/1997 | Abrokwah et al. |
| 5,614,739 A | 3/1997 | Abrokwah et al. |
| 5,640,267 A | 6/1997 | May et al. .................. 359/322 |
| 5,670,798 A | 9/1997 | Schetzina |
| 5,674,366 A | 10/1997 | Hayashi et al. |
| 5,729,394 A | 3/1998 | Sevier et al. |
| 5,729,641 A | 3/1998 | Chandonnet et al. ......... 385/2 |
| 5,731,220 A | 3/1998 | Tsu et al. |
| 5,733,641 A | 3/1998 | Fork et al. |
| 5,735,949 A | 4/1998 | Mantl et al. |
| 5,741,724 A | 4/1998 | Ramdani et al. |
| 5,764,676 A | 6/1998 | Paoli et al. |
| 5,777,762 A | 7/1998 | Yamamoto |
| 5,778,018 A | 7/1998 | Yoshikawa et al. |
| 5,778,116 A | 7/1998 | Tomich |
| 5,790,583 A | 8/1998 | Ho |
| 5,801,105 A | 9/1998 | Yano et al. |
| 5,810,923 A | 9/1998 | Yano et al. |
| 5,825,799 A | 10/1998 | Ho et al. |
| 5,828,080 A | 10/1998 | Yano et al. |
| 5,830,270 A | 11/1998 | McKee et al. |
| 5,857,049 A | 1/1999 | Beranek et al. |
| 5,858,814 A | 1/1999 | Goossen et al. |
| 5,861,966 A | 1/1999 | Ortel |
| 5,874,860 A | 2/1999 | Brunel et al. |
| 5,883,996 A | 3/1999 | Knapp et al. |
| 5,912,068 A | 6/1999 | Jia |
| 5,926,496 A | 7/1999 | Ho et al. |
| 5,937,285 A | 8/1999 | Abrokwah et al. |
| 5,981,400 A | 11/1999 | Lo |
| 5,990,495 A | 11/1999 | Ohba |
| 5,995,359 A | 11/1999 | Klee et al. |
| 6,002,375 A | 12/1999 | Corman et al. |
| 6,008,762 A | 12/1999 | Nghiem |
| 6,020,222 A | 2/2000 | Wollesen |
| 6,045,626 A | 4/2000 | Yano et al. |
| 6,055,179 A | 4/2000 | Koganei et al. |
| 6,058,131 A | 5/2000 | Pan |
| 6,064,078 A | 5/2000 | Northup et al. |
| 6,064,092 A | 5/2000 | Park |
| 6,096,584 A | 8/2000 | Ellis-Monaghan et al. |
| 6,103,008 A | 8/2000 | McKee et al. |
| 6,107,653 A | 8/2000 | Fitzgerald |
| 6,113,690 A | 9/2000 | Yu et al. |
| 6,114,996 A | 9/2000 | Nghiem |
| 6,121,642 A | 9/2000 | Newns |
| 6,128,178 A | 10/2000 | Newns |
| 6,136,666 A | 10/2000 | So |
| 6,137,603 A | 10/2000 | Henmi |
| 6,143,072 A | 11/2000 | McKee et al. |
| 6,146,906 A | 11/2000 | Inoue et al. |
| 6,173,474 B1 | 1/2001 | Conrad |
| 6,174,755 B1 | 1/2001 | Manning |
| 6,180,252 B1 | 1/2001 | Farrell et al. |
| 6,180,486 B1 | 1/2001 | Leobandung et al. |
| 6,184,144 B1 | 2/2001 | Lo |
| 6,222,654 B1 | 4/2001 | Frigo |

FOREIGN PATENT DOCUMENTS

| | | |
|---|---|---|
| JP | 52-88354 | 7/1977 |
| JP | 54-134554 | 10/1979 |
| JP | 55-87424 | 7/1980 |
| JP | 61-108187 | 5/1986 |
| JP | 63-34994 | 2/1988 |
| JP | 63-131104 | 6/1988 |
| JP | 63-198365 | 8/1988 |
| JP | 2-391 | 1/1990 |
| JP | 5-48072 | 2/1993 |
| JP | 5-291299 | 11/1993 |
| JP | 6-232126 | 8/1994 |
| JP | 6-291299 | 10/1994 |
| JP | 6-334168 | 12/1994 |
| JP | 10-321943 | 12/1998 |
| JP | 11-238683 | 8/1999 |
| JP | 11-260835 | 9/1999 |
| WO | WO 97/45827 | 12/1997 |
| WO | WO 00/14797 | 3/1999 |
| WO | WO 99/14804 | 3/1999 |
| WO | WO 99/19546 | 4/1999 |
| WO | WO 99/63580 | 12/1999 |
| WO | WO 00/33363 | 6/2000 |
| WO | WO 00/48239 | 8/2000 |

OTHER PUBLICATIONS

M. Rotter et al., "Nonlinear Acoustoelectric Interactions in GaAs/LiNbO$_3$ Structures", *Applied Physics Letters*, vol. 75(7), Aug. 16, 1999, pp. 965–967.

K. Sreenivas et al., "Surface Acoustic Wave Propagation on Lead Zirconate Titanate Thin Films," *Appl. Phys. Lett.* 52 (9), Feb. 29, 1998, pp. 709–711.

M. Rotter et al., "Single Chip Fused Hybrids for Acousto–Electric and Acousto–Optic Applications," 1997 *Applied Physics Letters*, vol. 70(16), Apr. 21, 1997, pp. 2097–2099.

A. Mansingh et al., "Surface Acoustic Wave Propagation in PZT/YBCO/SrTiO$_3$ and PbTiO$_3$/YBCO/SrTiO$_3$ Epitaxial Heterostructures," *Ferroelectric*, vol. 224, pp. 275–282, 1999.

S. Matthews et al., "Ferroelectric Field Effect Transistor Based on Epitaxial Perovskite Heterostructures", Science, vol. 276, Apr. 11, 1997, pp. 238–240.

R. Houdre et al., "Properties of GaAs on Si Grown by Molecular Beam Epitaxy," *Solid State and Materials Sciences*, vol. 16, Issue 2, 1990, pp. 91–114.

S. F. Fang et al., "Gallium Arsenide and Other Compound Semiconductors on Silicon," *J. Appl. Phys.*, 68(7), Oct. 1, 1990, pp. R31–R58.

Carlin et al., Impact of GaAs Buffer Thickness on Electronic Quality of GaAs Grown on Graded Ge/GeSi/Si Substrates, *Appl. Phys. Letter*, vol. 76, No.14, Apr. 2000, pp. 1884–1886.

Ringel et al., "Epitaxial Integration of III–V Materials and Devices with Si Using Graded GeSi Buffers," 27$^{th}$ International Symposium on Compound Semiconductors, Oct. 2000.

Zogg et al., "Progress in Compound–Semiconductor–on–Silicon–Heteroepitaxy with Fluoride Buffer Layers," *J. Electrochem Soc.*, vol. 136, No. 3, Mar. 1998, pp. 775–779.

Xiong et al., "Oxide Defined GaAs Vertical–Cavity Surface–Emitting Lasers on Si Substrates," *IEEE Photonics Technology Letters*, vol. 12, No. 2, Feb. 2000, pp. 110–112.

Clem et al., "Investigation of PZT//LSCO//Pt//Aerogel Thin Film Composites for Uncooled Pyroelectric IR Detectors," *Mat. Res. Soc. Symp. Proc.*, vol. 541, pp. 661–666, 1999.

Gunapala et al., "Bound–To–Quasi–Bound Quantum–Well Infrared Photodetectors," NASA Tech Brief, vol. 22, No. 9, Sep. 1998.

Abhay M. Joshi et al., "Monolithic InGaAs–on–silicon Wave Infrared Detector Arrays," Intn. Society for Optical Engineering, vol. 2999, pp. 211–224.

Bruley et al., "Nanostructure and Chemistry of a (100)MgO/(100) GaAs Interface," *Appl. Phys Lett*, 65(5), Aug. 1994, pp. 564–566.

Fork et al., "Epitaxial MgO On Si(001) for Y–Ba–Cu–O Thin Film Growth by Pulsed Laser Deposition," *Appl. Phys Lett.*, 58(20), May 20, 1991, pp. 2294–2296.

Himpsel et al., "Dialectrics on Semiconductors," *Materials Science and Engineering*, B1(1988), pp. 9–13.

Li et al., "Epitaxial La$_{0.67}$Sr$_{0.33}$MnO$_3$ Magnetic Tunnel Junctions," *J. Appl. Phys.* 81(8), Apr. 15, 1997, pp. 5509–5511.

O'Donnell et al., "Colossal Magnetoresistance Magnetic Tunnel Junctions Grown by Molecular–Beam Epitaxy," *Appl. Physics Letters* vol. 76, No. 14, Apr. 3, 2000, pp. 1914–1916.

Mikami et al., "Formation of Si Epi/MgO–Al$_2$O$_3$Epi./Si and Its Epitaxial Film Quality," Fundamental Research Laboratories and Microelectronics, pp. 31–34, 1983.

T. Asano et al., "An Epitaxial Si/Insulator/Si Structure Prepared by Vacuum Deposition of CaF$_2$ and Silicon," *Thin Solid Films*, vol. 93 (1982), pp. 143–150.

T. Chikyow et al., "Reaction and Regrowth Control of CeO$_2$ on Si(111) Surface for the Silicon–On–Insulator Structure," *Appl. Phys. Lett.*, vol. 65, No. 8, Aug. 22, 1994, pp. 1030–1032.

J.F. Kang, et al., "Epitaxial Growth of CeO$_2$(100) Films on Si(100) Substrates by Dual Ion Beams Reactive Sputtering," *Solid State Communications*, vol. 108, No. 4, pp. 225–227, 1998.

R.A. Morgan et al., "Vertical–Cavity Surface–Emitting Lasers Come of Age," *SPIE*, vol. 2683, pp. 18–29.

"Technical Analysis of Qualcomm QCP–800 Portable Cellular Phone (Transmitter Circuitry)," Talus Corporation, Qualcomm QCP–800 Technical Analysis Report, Dec. 10, 1996, pp. 5–8.

Jo–Ey Wong, et al.; "An Electrostatically–Actuated Mems Switch for Power Applications"; IEEE, 2000, pp. 633–638.

T. Mizuno, et al.; "Electron and Hole Mobility Enhancement in Strained–Si MOSFET's on SiGe–on–Insulator Substrates Fabricated by SIMOX Technology"; IEEE Electron Device Letters, vol. 21, No. 5, May 2000; pp. 230–232.

F.M. Buffer, et al.; "Strain–dependence of electron transport in bulk Si and deep–submicron MOSFET's" Computatural Electronics, 2000, Book of Abstracts, IWCE Glasgow 2000, Int'l Workshop on, 2000; pp. 64–65.

S.S. Lu, et al.; "Piezoelectric field effect transistor (PEFET) using in$_{0.2}$Ga$_{0.8}$As/Al$_{0.35}$Ga$_{0.65}$As/In$_{0.2}$Ga$_{0.8}$As/GaAs Strained layer structure on (111)B GaAs substrate"; Electronics Letters, 12$^{th}$ Ma 1994, vol. 30, No. 10; pp. 823–825.

Kihong Kim, et al." On–Chip Wireless Interconnection with Integrated Antennas"; 2000 IEEE; pp. 20.2.1–20.3.4.

G. Passiopoulos, et al.; "V–Band Single Chip, Direct Carrier BPSK Modulation Transmitter With Integrated Patch Antenna"; 1998 IEEE MTT–S Digest; pp. 305–308.

Mau–Chung Frank Chang, et al.; "RF/Wireless Interconnect for Inter–and Intra–Chip Communications"; Proceedings of the IEEE, vol. 89, No. 4, Apr. 2001; pp. 456–466.

The Electronics Industry Report; Prismark; 2001; pp. 111–120.

J.K. Abrokwah, et al.; "A Manufacturable Complementary GaAs Process"; GaAs IC Symposium, IEEE, 1993; pp. 127–130.

H. Nagata, "A Preliminary Consideration of the Growth Behaviour of CeO$_2$, SrTiO$_3$ and SrVO$_3$ Films on Si Substrate," *Thin Solid Films*, 224, 1993, pp. 1–3.

Nagata et al., "Heteroepitaxial Growth of CeO$_2$(001) Films on Si(001) Substrates by Pulsed Laser Deposition in Ultrahigh Vacuum," *Jpn. Jour. Appl. Phys.*, vol. 30, No. 6B, Jun. 1991, pp. L1136–L1138.

Kado et al., "Heteroepitaxial Growth of SrO Films on Substrates," *J. Appl. Phys.*, 61(6), Mar. 15, 1987, pp. 2398–2400.

Ishawara et al., "Silicon Molecular Beam Epitaxy," *Materials Research Symposium Proceedings*, vol. 220, pp. 595–600, Apr. 29 –May 3, 1991.

J.K. Abrokwah, et al.; "A Manufacturable High–Speed Low–Power Complementary GaAs Process"; Extended Abstracts of the 1994 International Conference on Solid State Devices and Materials, Yokohama, 1994, pp. 592–594.

Leonard J. Brillson; "Stable and Epitaxial Contacts to III–V Compound Semiconductors"; Semiconductors Fundamentals and Technology; Noyles Publications, 1993; pp. 67–150.

Jayshri Sabarinathat, et al.; "Submicron three–dimensional infrared GaAs/Al$_x$O$_y$–based photonic crystal using single–step epitaxial growth"; Applied Physics Letters, vol. 78, No. 20, May 14, 2001; pp. 3024–3026.

Philip Ball; "The Next Generation of Optical Fibers", Technology Review, May 2001; pp. 55–61.

John D. Joannopoulos, et al.; "Molding the Flow of Light"; Photonic Crystals; Princeton University Press, 1995.

Thomas F. Krauss, et al.; "Photonic crystals in the optical regime–past, present and future"; Progress in Quantum Electronics 23 (1999) 51–96.

G. H. Jin, et al.; "PLZT Film Waveguide Mach–Zehnder Electrooptic Modulator"; Journal of Lightwave Technology, vol. 18, No. 6, Jun. 2000; pp. 807–812.

D.E. Aspnes, et al.; "Steps on (001) silicon surfaces"; J. Vac. Sci. Technol. B, vol. 5, No. 4, Jul./Aug. 1987; pp. 939–944.

D.M. Newns, et al.; "Mott transition field effect transistor"; Applied Physics Letters, vol. 73, No. 6, 10 Aug. 1998; pp. 780–782.

Lucent Technologies, Inc. "Arrayed Waveguide Grating Multiplexer/Demultiplexer", Jan. 2000; 4 pages.

Hisashi Shichijo, et al.; "Co–Integration of GaAs MESFET and Si CMOS Circuits", IEEE Electron Device Letters, vol. 9, No. 9, Sep. 1988; pp. 444–446.

H. Shichijo, et al.; "GaAs MESFET and Si CMOS Cointegration and Circuit Techniques", 1988 IEEE; GaAs IC Symposium–239–242.

H. Shichijo, et al.; "Monolithic Process for Co–Integration of GaAs and Silicon Circuits"; 1988 IEEE; pp. 778–781.

Z.H. Zhu, et al. "Growth of InGaAs multi–quantum wells at 1.3μm wavelength on GaAs compliant substrates"; Applied Physics Letters, vol. 72, No. 20, May 18, 1998; pp. 2598–2600.

Kurt Eisenbeiser, et al.; "Metamorphic InAiAs/InGaAs Enhancement Mode HEMT's on GaAs Substrates"; IEEE Electron Device Letters, vol. 20, No. 10, Oct. 1999; pp. 507–509.

Tomonori Nagashima, et al.; "Three–Terminal Tandem Solar Cells With a Back–Contact Type Bottom Cell" Higashifuji Technical Center, Toyota Motor Corporation; 4 pages.

James Schellenberg, et al.; "Low–Loss, Planar Monolithic Baluns for K/Ka–Band Applications"; 1999 IEEE MTT–S Digest; pp. 1733–1736.

Patent Abstracts of Japan, vol. 012, No. 077, Mar. 10, 1988 & JP 62 216600, Sep. 24, 1987.

R.D. Vispute; "High quality optoelectronic grade epitaxial AlN films on $\alpha-Al_2O_3$, Si and 6H–SIC by pulsed laser deposition"; Thin Solid Films 299 (1997), pp. 94–103.

T. Warren Weeks, et al.; "GaN thin films deposited via organometallic vapor phase epitaxy on α(6H)–SIC(0001) using high–temperature monocrystalline AlN buffer layers" 320 Applied Physics Letters, vol. 67, No. 3, Jul. 17, 1995, pp1401–403.

Z. Yu, et al.; "Epitaxial oxide thin films on Si(001)*"; J. Vac. Sci. Technol. B. vol. 18, No. 4, Jul./Aug. 2000; pp. 2139–2145.

Gentex Corporate Website; Photoelectric Smoke Detectors–How They Work; 2001.

Jeffrey B. Casady, et al.; "A Hybrid 6H–SiC Temperature Sensor Operational from 25° C to 500° C"; IEEE Transactions on Components, Packaging, and Manufacturing Technology–Part A, vol. 19, No. 3, Sep. 1996; pp. 416–422.

Ronald W. Waynant, et al.; "Optoelectronic Integrated Circuits"; Electro–Optics Handbook, McGraw–Hill, Inc., 1994; Chapter Twenty Seven.

Antonio Mecozzi, et al.; "The Roles of Semiconductor Optical Amplifiers in Optical Networks"; Optics & Photonics News; Mar. 2001; pp. 37–42.

D.A. Francis, et al.; "A single–chip linear optical amplifier", OFC, 2001; Mar. 17–22, 2001.

Patent Abstracts of Japan, vol. 015, No. 098, Mar. 8, 1991 & JP 02 306680. Dec. 20, 1990.

Ishiwara et al., "Heteroepitaxy on Silicon: Fundamentals, Structure and Devices," *Mat. Res. Soc.*, Symposium Proceedings, vol. 116, pp. 369–374, Apr. 5–8, 1988.

Douglas B. Chrisey, et al; Pulsed Laser Deposition of Thin Films; pp. 273–285.

B.A. Block, et al; "Photoluminescence properties of $Er^3$–doped $BaTiO_3$ thin films"; Appl. Phys. Lett. 65 (1), Jul. 4, 1994, pp. 25–27.

"Integration of GaAs on Si Using a Spinel Buffer Layer", IBM Technical Bulletin, vol. 30, No. 6, Nov. 1987, p. 365.

"GaInAs Superconducting FET," IBM Technical Bulletin, vol. 36, No. 8, Aug. 1993, pp. 655–656.

"Epitaxial 3d Structure Using Mixed Spinels," IBM Technical Bulletin, vol. 30, No. 3, Aug. 1987, p. 1271.

Moon et al., "Roles of Buffer Layers in Epitaxial Growth of $SrTiO_3$ Films on Silicon Substrates," *Japan J of Appl. Phys.*, vol. 33, Mar. 1994, pp. 1472–1477.

Yodo et al., GaAs Heteroepitaxial Growth on Si Substrates with Thin Si Interlayers *in situ* Annealed at High Temperatures, 8257b *Journal of Vacuum Science & Technology*, 1995 May/Jun., vol. 13, No. 3, pp. 1000–1005.

Cuomo et al., "Substrate Effect on the Superconductivity of $YBa_2Cu_3O_7$ Thin Films," AIP Conference 1988, pp. 141–148.

McKee et al., "Crystalline Oxides on Silicon: The First Five Monolayers," *Physical Review Letters*, vol. 81, No. 14, Oct. 1998, pp. 3014–3017.

McKee et al., "Molecular Beam Epitaxy Growth of Epitaxy Barium Silicide, Barium Oxide, and Barium Titanate on Silicon," *1991 American Institute of Physics*, pp. 782–784, Aug. 13, 1991.

Tambo et al., Molecular Beam Epitaxy Growth of $SrTiO_3$ Films on Si(100)–2x1 with SrO Buffer Layer, *Jpn. J. Appl. Phys.*, vol. 37, 1998, pp. 4454–4459.

McKee et al., "The MBE Growth and Optical Quality of $BaTiO_3$ and $SrTiO_3$ Thin Films on MgO," *Mat. Res. Soc. Symp. Proc.*, vol. 341, Apr. 1994, pp. 309–314.

McKee et al., "$BaSi_2$ and Thin Film Alkaline Earth Silicides on Silicon," *Appl. Phys. Lett.*, 63 (20), Nov. 1993, pp. 2818–2820.

McKee et al., "Surface Structures and Orthorhombic Transformation of Thin Film $BaSi_2$ on Silicon," *Mat. Res. Soc. Symp. Proc.*, vol. 221, pp. 131–136.

Brian A. Floyd, et al.; "The projected Power Consumption of a Wireless Clock Distribution System and Comparison to Conventional Distribution Systems"; IEEE, 1999; pp. IITC99–249–IITC99–250.

Mori et al., "Epitaxial Growth of $SrTiO_3$ Films on Si(100) Substrates Using a Focused Electron Beam Evaporation Method," *Jpn. J. of Apl. Phys.*, vol. 30, No. 8A, Aug. 1991, pp. L1415–L1417.

Moon et al., "Growth of Crystalline $SrTiO_3$ Films on Si Substrates Using Thin Fluoride Buffer Layers and Their Electrical Properties," *Jpn. J. of Appl. Phys.*, vol. 33, (1994), pp. 5911–5916.

Farrow et al., "Heteroepitaxy of Dissimilar Materials," *Mat. Res. Soc. Symposium Proceedings*, vol. 221, pp. 29–34, Apr. 29–May 2, 1991.

* cited by examiner

INTEGRATED CIRCUITS WITH OPTICAL SIGNAL PROPAGATION

BACKGROUND OF THE INVENTION

This invention relates to signal propagation on integrated circuits. More particularly, this invention relates to optical signal propagation on integrated circuits having conventional electrical semiconductor circuit elements.

Advances in integrated circuit fabrication technology make possible both larger and denser integrated circuits. These integrated circuits can be fabricated as a single chip or as an integrated wafer. A chip is a piece of semiconductor material having fabricated thereon a number of interconnected circuit elements (such as, for example, transistors, diodes, resistors, and capacitors). Typically, multiple identical chips are fabricated on a single wafer, which is a larger piece of semiconductor material. An integrated wafer has multiple circuits fabricated thereon that are interconnected to form a single circuit the full size of the wafer. This is commonly known as wafer-scale integration.

Many integrated circuit architectures require certain signals to be supplied to many circuits. For example, many circuits may need to receive the same clock or control signals. Similarly, many circuits may need to receive the same data signals. In some cases, each of several data or control signals may need to go to respective different groups of circuits. Accordingly, as integrated circuits become larger and denser, signal routing becomes more difficult, causing more valuable integrated circuit area to be used for routing data busses and global clock and control lines.

Moreover, an increasing number of integrated circuit applications requires significantly increased performance, even ultra-high performance. However, large integrated circuits typically have long and complex signal paths in which signals are often routed through multiple wiring planes. Such long complex paths usually increase signal propagation delay, which can adversely affect performance, because the operating speed of an integrated circuit (i.e., its performance) is directly affected by signal propagation delay—the longer the delay, the worse the performance. Accordingly, large amounts of data and clock and control signals need to be propagated at rapid rates of speed in order to meet such ultra-high performance requirements.

Furthermore, long complex clock lines can result in skewing problems, making clock synchronization more difficult. Skew refers to different amounts of delay associated with clock signals reaching different circuits. To reduce or eliminate clock skew, long complex clock lines usually need additional circuitry to re-synchronize the phasing of the clock signal. Alternatively, a more complex system design can be used to compensate for the clock skew. Such a system design may involve, for example, circuitry to delay the signals of some portions of the circuit, thereby slowing overall operations. In either case, additional integrated circuit area is needed to support the additional clock circuitry, which further increases power dissipation on the integrated circuit.

Accordingly, a need exists for large dense integrated circuits that have additional global wiring paths not requiring additional integrated circuit area. A need also exists for rapid data, clock, and control signal propagation; reduced power dissipation; and clock signals with little or no skew.

BRIEF DESCRIPTION OF THE DRAWINGS

The features and advantages of the invention will be apparent upon consideration of the following detailed description, taken in conjunction with the accompanying drawings, in which like reference characters refer to like parts throughout, and in which.

Skilled artisans will appreciate that in many cases elements in certain FIGS. are illustrated for simplicity and clarity and have not necessarily been drawn to scale. For example, the dimensions of some of the elements in certain FIGS. may be exaggerated relative to other elements to help to improve understanding of what is being shown.

DETAILED DESCRIPTION OF THE INVENTION

The present invention involves semiconductor structures of particular types. For convenience herein, these semiconductor structures are sometimes referred to as "composite semiconductor structures" or "composite integrated circuits" because they include two (or more) significantly different types of semiconductor devices in one integrated structure or circuit. For example, one of these two types of devices may be silicon-based devices such as CMOS devices, and the other of these two types of devices may be compound semiconductor devices such GaAs devices. Illustrative composite semiconductor structures and methods for making such structures are disclosed in Ramdani et al. U.S. patent application Ser. No. 09/502,023, filed Feb. 10, 2000, which is hereby incorporated by reference herein in its entirety. Certain material from that reference is substantially repeated below to ensure that there is support herein for references to composite semiconductor structures and composite integrated circuits.

Figure 1:
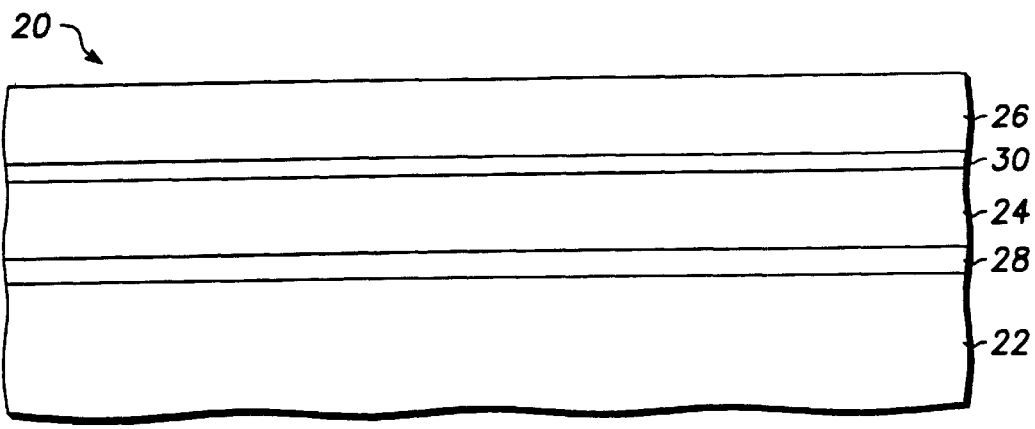
FIGS. 1, 2, 3, 9, 10 illustrate schematically, in cross section, device structures that can be used in accordance with various embodiments of the invention.

FIG. 1 illustrates schematically, in cross section, a portion of a semiconductor structure 20 which may be relevant to or useful in connection with certain embodiments of the present invention. Semiconductor structure 20 includes a monocrystalline substrate 22, accommodating buffer layer 24 comprising a monocrystalline material, and a layer 26 of a monocrystalline compound semiconductor material. In this context, the term "monocrystalline" shall have the meaning commonly used within the semiconductor industry. The term shall refer to materials that are a single crystal or that are substantially a single crystal and shall include those materials having a relatively small number of defects such as dislocations and the like as are commonly found in substrates of silicon or germanium or mixtures of silicon and germanium and epitaxial layers of such materials commonly found in the semiconductor industry.

In accordance with one embodiment, structure 20 also includes an amorphous intermediate layer 28 positioned between substrate 22 and accommodating buffer layer 24. Structure 20 may also include a template layer 30 between accommodating buffer layer 24 and compound semiconductor layer 26. As will be explained more fully below, template layer 30 helps to initiate the growth of compound semiconductor layer 26 on accommodating buffer layer 24. Amorphous intermediate layer 28 helps to relieve the strain in accommodating buffer layer 24 and by doing so, aids in the growth of a high crystalline quality accommodating buffer layer 24.

Substrate 22, in accordance with one embodiment, is a monocrystalline semiconductor wafer, preferably of large diameter. The wafer can be of a material from Group IV of the periodic table, and preferably a material from Group IVA. Examples of Group IV semiconductor materials include silicon, germanium, mixed silicon and germanium, mixed silicon and carbon, mixed silicon, germanium and carbon, and the like. Preferably substrate 22 is a wafer containing silicon or germanium, and most preferably is a high quality monocrystalline silicon wafer as used in the semiconductor industry. Accommodating buffer layer 24 is preferably a monocrystalline oxide or nitride material epitaxially grown on the underlying substrate 22. In accordance with one embodiment, amorphous intermediate layer 28 is grown on substrate 22 at the interface between substrate 22 and the growing accommodating buffer layer 24 by the oxidation of substrate 22 during the growth of layer 24. Amorphous intermediate layer 28 serves to relieve strain that might otherwise occur in monocrystalline accommodating buffer layer 24 as a result of differences in the lattice constants of substrate 22 and buffer layer 24. As used herein, lattice constant refers to the distance between atoms of a cell measured in the plane of the surface. If such strain is not relieved by amorphous intermediate layer 28, the strain may cause defects in the crystalline structure of accommodating buffer layer 24. Defects in the crystalline structure of accommodating buffer layer 24, in turn, would make it difficult to achieve a high quality crystalline structure in monocrystalline compound semiconductor layer 26.

Accommodating buffer layer 24 is preferably a monocrystalline oxide or nitride material selected for its crystalline compatibility with underlying substrate 22 and with overlying compound semiconductor material 26. For example, the material could be an oxide or nitride having a lattice structure matched to substrate 22 and to the subsequently applied semiconductor material 26. Materials that are suitable for accommodating buffer layer 24 include metal oxides such as the alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, perovskite oxides such as alkaline earth metal tin-based perovskites, lanthanum aluminate, lanthanum scandium oxide, and gadolinium oxide. Additionally, various nitrides such as gallium nitride, aluminum nitride, and boron nitride may also be used for accommodating buffer layer 24. Most of these materials are insulators, although strontium ruthenate, for example, is a conductor. Generally, these materials are metal oxides or metal nitrides, and more particularly, these metal oxide or nitrides typically include at least two different metallic elements. In some specific applications, the metal oxides or nitride may include three or more different metallic elements.

Amorphous interface layer 28 is preferably an oxide formed by the oxidation of the surface of substrate 22, and more preferably is composed of a silicon oxide. The thickness of layer 28 is sufficient to relieve strain attributed to mismatches between the lattice constants of substrate 22 and accommodating buffer layer 24. Typically, layer 28 has a thickness in the range of approximately 0.5–5 nm.

The compound semiconductor material of layer 26 can be selected, as needed for a particular semiconductor structure, from any of the Group IIIA and VA elements (III–V semiconductor compounds), mixed III–V compounds, Group II(A or B) and VIA elements (II–VI semiconductor compounds), and mixed II–VI compounds. Examples include gallium arsenide (GaAs), gallium indium arsenide (GaInAs), gallium aluminum arsenide (GaAlAs), indium phosphide (InP), cadmium sulfide (CdS), cadmium mercury telluride (CdHgTe), zinc selenide (ZnSe), zinc sulfur selenide (ZnSSe), and the like. Suitable template 30 materials chemically bond to the surface of the accommodating buffer layer 24 at selected sites and provide sites for the nucleation of the epitaxial growth of the subsequent compound semiconductor layer 26. Appropriate materials for template 30 are discussed below.

Figure 2:
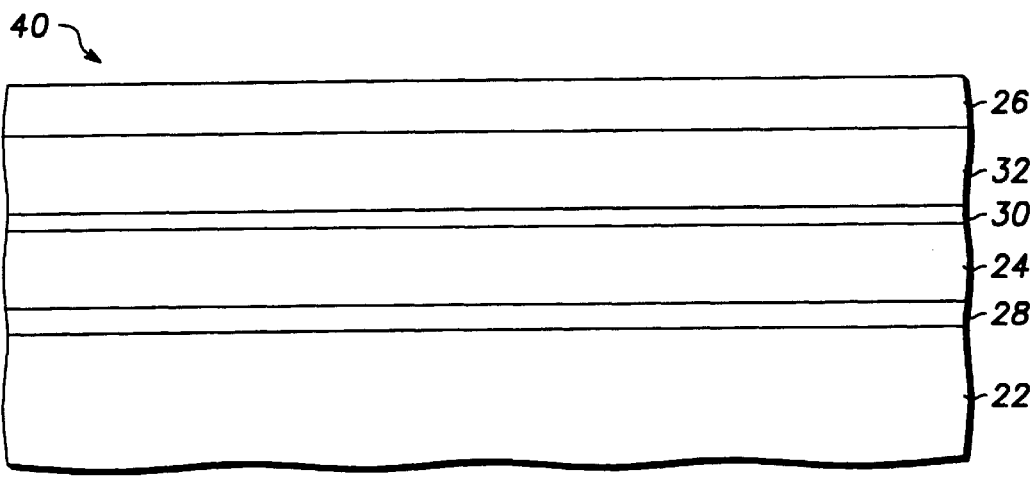

FIG. 2 illustrates, in cross section, a portion of a semiconductor structure 40 in accordance with a further embodiment. Structure 40 is similar to the previously described semiconductor structure 20 except that an additional buffer layer 32 is positioned between accommodating buffer layer 24 and layer of monocrystalline compound semiconductor material 26. Specifically, additional buffer layer 32 is positioned between the template layer 30 and the overlying layer 26 of compound semiconductor material. Additional buffer layer 32, formed of a semiconductor or compound semiconductor material, serves to provide a lattice compensation when the lattice constant of accommodating buffer layer 24 cannot be adequately matched to the overlying monocrystalline compound semiconductor material layer 26.

Figure 3:
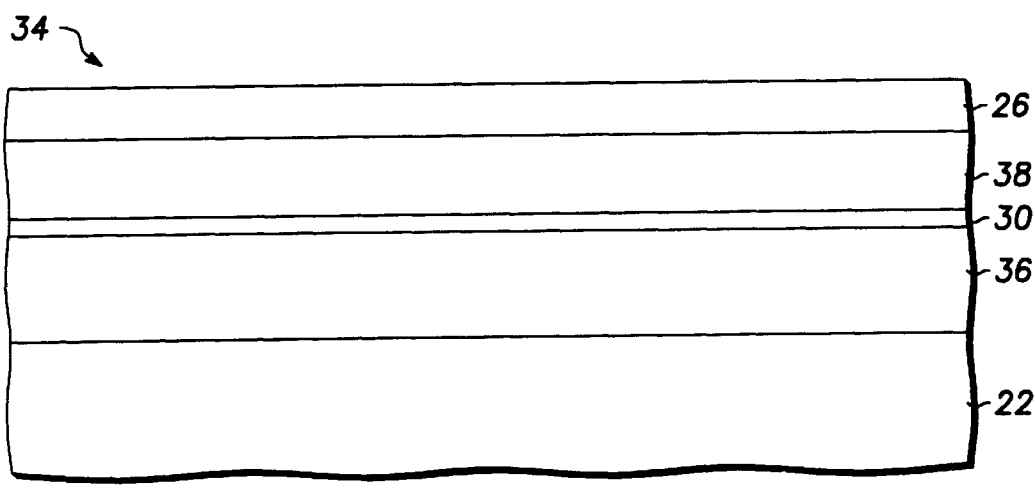

FIG. 3 schematically illustrates, in cross section, a portion of a semiconductor structure 34 in accordance with another exemplary embodiment of the invention. Structure 34 is similar to structure 20, except that structure 34 includes an amorphous layer 36, rather than accommodating buffer layer 24 and amorphous interface layer 28, and an additional semiconductor layer 38.

As explained in greater detail below, amorphous layer 36 may be formed by first forming an accommodating buffer layer and an amorphous interface layer in a similar manner to that described above. Monocrystalline semiconductor layer 26 is then formed (by epitaxial growth) overlying the monocrystalline accommodating buffer layer. The accommodating buffer layer is then exposed to an anneal process to convert the monocrystalline accommodating buffer layer to an amorphous layer. Amorphous layer 36 formed in this manner comprises materials from both the accommodating buffer and interface layers, which amorphous layers may or may not amalgamate. Thus, layer 36 may comprise one or two amorphous layers. Formation of amorphous layer 36 between substrate 22 and semiconductor layer 38 (subsequent to layer 38 formation) relieves stresses between layers 22 and 38 and provides a true compliant substrate for subsequent processing—e.g., compound semiconductor layer 26 formation.

The processes previously described above in connection with FIGS. 1 and 2 are adequate for growing monocrystalline compound semiconductor layers over a monocrystalline substrate. However, the process described in connection with FIG. 3, which includes transforming a monocrystalline accommodating buffer layer to an amorphous oxide layer, may be better for growing monocrystalline compound semiconductor layers because it allows any strain in layer 26 to relax. Semiconductor layer 38 may include any of the materials described throughout this application in connection with either of compound semiconductor material layer 26 or additional buffer layer 32. For example, layer 38 may include monocrystalline Group IV or monocrystalline compound semiconductor materials.

In accordance with one embodiment of the present invention, semiconductor layer 38 serves as an anneal cap during layer 36 formation and as a template for subsequent semiconductor layer 26 formation. Accordingly, layer 38 is preferably thick enough to provide a suitable template for layer 26 growth (at least one monolayer) and thin enough to allow layer 38 to form as a substantially defect free monocrystalline semiconductor compound.

In accordance with another embodiment of the invention, semiconductor layer 38 comprises compound semiconductor material (e.g., a material discussed above in connection with compound semiconductor layer 26) that is thick enough to form devices within layer 38. In this case, a semiconductor structure in accordance with the present invention does not include compound semiconductor layer 26. In other words, the semiconductor structure in accordance with this embodiment only includes one compound semiconductor layer disposed above amorphous oxide layer 36.

The layer formed on substrate 22, whether it includes only accommodating buffer layer 24, accommodating buffer layer 24 with amorphous intermediate or interface layer 28, or an amorphous layer such as layer 36 formed by annealing layers 24 and 28 as described above in connection with FIG. 3, may be referred to generically as an "accommodating layer."

The following non-limiting, illustrative examples illustrate various combinations of materials useful in structures 20, 40 and 34 in accordance with various alternative embodiments. These examples are merely illustrative, and it is not intended that the invention be limited to these illustrative examples.

Example 1

In accordance with one embodiment, monocrystalline substrate 22 is a silicon substrate oriented in the (100) direction. Silicon substrate 22 can be, for example, a silicon substrate as is commonly used in making complementary metal oxide semiconductor (CMOS) integrated circuits having a diameter of about 200–300 mm. In accordance with this embodiment, accommodating buffer layer 24 is a monocrystalline layer of $Sr_zBa_{1-z}TiO_3$ where z ranges from 0 to 1 and amorphous intermediate layer 28 is a layer of silicon oxide ($SiO_x$) formed at the interface between silicon substrate 22 and accommodating buffer layer 24. The value of z is selected to obtain one or more lattice constants closely matched to corresponding lattice constants of the subsequently formed layer 26. Accommodating buffer layer 24 can have a thickness of about 2 to about 100 nanometers (nm) and preferably has a thickness of about 10 nm. In general, it is desired to have an accommodating buffer layer 24 thick enough to isolate compound semiconductor layer 26 from substrate 22 to obtain the desired electrical and optical properties. Layers thicker than 100 nm usually provide little additional benefit while increasing cost unnecessarily; however, thicker layers may be fabricated if needed. The amorphous intermediate layer 28 of silicon oxide can have a thickness of about 0.5–5 nm, and preferably a thickness of about 1.5–2.5 nm.

In accordance with this embodiment, compound semiconductor material layer 26 is a layer of gallium arsenide (GaAs) or aluminum gallium arsenide (AlGaAs) having a thickness of about 1 nm to about 100 micrometers ($\mu$m) and preferably a thickness of about 0.5 $\mu$m to 10 $\mu$m. The thickness generally depends on the application for which the layer is being prepared. To facilitate the epitaxial growth of the gallium arsenide or aluminum gallium arsenide on the monocrystalline oxide, a template layer 30 is formed by capping the oxide layer. Template layer 30 is preferably 1–10 monolayers of Ti—As, Sr—O—As, Sr—Ga—O, or Sr—Al—O. By way of a preferred example, 1–2 monolayers 30 of Ti—As or Sr—Ga—O have been shown to successfully grow GaAs layers 26.

Example 2

In accordance with a further embodiment, monocrystalline substrate 22 is a silicon substrate as described above. Accommodating buffer layer 24 is a monocrystalline oxide of strontium or barium zirconate or hafnate in a cubic or orthorhombic phase with an amorphous intermediate layer 28 of silicon oxide formed at the interface between silicon substrate 22 and accommodating buffer layer 24. Accommodating buffer layer 24 can have a thickness of about 2–100 nm and preferably has a thickness of at least 5 nm to ensure adequate crystalline and surface quality and is formed of a monocrystalline $SrZrO_3$, $BaZrO_3$, $SrHfO_3$, $BaSnO_3$ or $BaHfO_3$. For example, a monocrystalline oxide layer of $BaZrO_3$ can grow at a temperature of about 700 degrees C. The lattice structure of the resulting crystalline oxide exhibits a 45 degree rotation with respect to the substrate 22 silicon lattice structure.

An accommodating buffer layer 24 formed of these zirconate or hafnate materials is suitable for the growth of compound semiconductor materials 26 in the indium phosphide (InP) system. The compound semiconductor material 26 can be, for example, indium phosphide (InP), indium gallium arsenide (InGaAs), aluminum indium arsenide, (AlInAs), or aluminum gallium indium arsenic phosphide (AlGaInAsP), having a thickness of about 1.0 nm to 10 $\mu$m. A suitable template 30 for this structure is 1–10 monolayers of zirconium-arsenic (Zr—As), zirconium-phosphorus (Zr—P), hafnium-arsenic (Hf—As), hafnium-phosphorus (Hf—P), strontium-oxygen-arsenic (Sr—O—As), strontium-oxygen-phosphorus (Sr—O—P), barium-oxygen-arsenic (Ba—O—As), indium-strontium-oxygen (In—Sr—

O), or barium-oxygen-phosphorus (Ba—O—P), and preferably 1–2 monolayers of one of these materials. By way of an example, for a barium zirconate accommodating buffer layer 24, the surface is terminated with 1–2 monolayers of zirconium followed by deposition of 1–2 monolayers of arsenic to form a Zr—As template 30. A monocrystalline layer 26 of the compound semiconductor material from the indium phosphide system is then grown on template layer 30. The resulting lattice structure of the compound semiconductor material 26 exhibits a 45 degree rotation with respect to the accommodating buffer layer 24 lattice structure and a lattice mismatch to (100) InP of less than 2.5%, and preferably less than about 1.0%.

Example 3

In accordance with a further embodiment, a structure is provided that is suitable for the growth of an epitaxial film of a II–VI material overlying a silicon substrate 22. The substrate 22 is preferably a silicon wafer as described above. A suitable accommodating buffer layer 24 material is $Sr_xBa_{1-x}TiO_3$, where x ranges from 0 to 1, having a thickness of about 2–100 nm and preferably a thickness of about 5–15 nm. The II–VI compound semiconductor material 26 can be, for example, zinc selenide (ZnSe or zinc sulfur selenide (ZnSSe). A suitable template 30 for this material system includes 1–10 monolayers of zinc-oxygen (Zn—O) followed by 1–2 monolayers of an excess of zinc followed by the selenidation of zinc on the surface. Alternatively, a template 30 can be, for example, 1–10 monolayers of strontium-sulfur (Sr—S) followed by the ZnSSe.

Example 4

This embodiment of the invention is an example of structure 40 illustrated in FIG. 2. Substrate 22, monocrystalline oxide layer 24, and monocrystalline compound semiconductor material layer 26 can be similar to those described in example 1. In addition, an additional buffer layer 32 serves to alleviate any strains that might result from a mismatch of the crystal lattice of the accommodating buffer layer and the lattice of the monocrystalline semiconductor material. Buffer layer 32 can be a layer of germanium or a GaAs, an aluminum gallium arsenide (AlGaAs), an indium gallium phosphide (InGaP), an aluminum gallium phosphide (AlGaP), an indium gallium arsenide (InGaAs), an aluminum indium phosphide (AlInP), a gallium arsenide phosphide (GaAsP), or an indium gallium phosphide (InGaP) strain compensated superlattice. In accordance with one aspect of this embodiment, buffer layer 32 includes a $GaAs_xP_{1-x}$ superlattice, wherein the value of x ranges from 0 to 1. In accordance with another aspect, buffer layer 32 includes an $In_yGa_{1-y}P$ superlattice, wherein the value of y ranges from 0 to 1. By varying the value of x or y, as the case may be, the lattice constant is varied from bottom to top across the superlattice to create a match between lattice constants of the underlying oxide and the overlying compound semiconductor material. The compositions of other materials, such as those listed above, may also be similarly varied to manipulate the lattice constant of layer 32 in a like manner. The superlattice can have a thickness of about 50–500 nm and preferably has a thickness of about 100–200 nm. The template for this structure can be the same of that described in example 1. Alternatively, buffer layer 32 can be a layer of monocrystalline germanium having a thickness of 1–50 nm and preferably having a thickness of about 2–20 nm. In using a germanium buffer layer, a template layer of either germanium-strontium (Ge—Sr) or germanium-titanium (Ge—Ti) having a thickness of about one monolayer can be used as a nucleating site for the subsequent growth of the monocrystalline compound semiconductor material layer. The formation of the oxide layer is capped with either a monolayer of strontium or a monolayer of titanium to act as a nucleating site for the subsequent deposition of the monocrystalline germanium. The monolayer of strontium or titanium provides a nucleating site to which the first monolayer of germanium can bond.

Example 5

This example also illustrates materials useful in a structure 40 as illustrated in FIG. 2. Substrate material 22, accommodating buffer layer 24, monocrystalline compound semiconductor material layer 26 and template layer 30 can be the same as those described above in example 2. In addition, a buffer layer 32 is inserted between accommodating buffer layer 24 and overlying monocrystalline compound semiconductor material layer 26. Buffer layer 32, a further monocrystalline semiconductor material, can be, for example, a graded layer of indium gallium arsenide (InGaAs) or indium aluminum arsenide (InAlAs). In accordance with one aspect of this embodiment, buffer layer 32 includes InGaAs, in which the indium composition varies from 0 to about 47%. Buffer layer 32 preferably has a thickness of about 10–30 nm. Varying the composition of buffer layer 32 from GaAs to InGaAs serves to provide a lattice match between the underlying monocrystalline oxide material 24 and the overlying layer 26 of monocrystalline compound semiconductor material. Such a buffer layer 32 is especially advantageous if there is a lattice mismatch between accommodating buffer layer 24 and monocrystalline compound semiconductor material layer 26.

Example 6

This example provides exemplary materials useful in structure 34, as illustrated in FIG. 3. Substrate material 22, template layer 30, and monocrystalline compound semiconductor material layer 26 may be the same as those described above in connection with example 1.

Amorphous layer 36 is an amorphous oxide layer which is suitably formed of a combination of amorphous intermediate layer materials (e.g., layer 28 materials as described above) and accommodating buffer layer materials (e.g., layer 24 materials as described above). For example, amorphous layer 36 may include a combination of SiOx and SrzBa1-z TiO3 (where z ranges from 0 to 1), which combine or mix, at least partially, during an anneal process to form amorphous oxide layer 36.

The thickness of amorphous layer 36 may vary from application to application and may depend on such factors as desired insulating properties of layer 36, type of semiconductor material comprising layer 26, and the like. In accordance with one exemplary aspect of the present embodiment, layer 36 thickness is about 2 nm to about 100 nm, preferably about 2–10 nm, and more preferably about 5–6 nm.

Layer 38 comprises a monocrystalline compound semiconductor material that can be grown epitaxially over a monocrystalline oxide material such as material used to form accommodating buffer layer 24. In accordance with one embodiment of the invention, layer 38 includes the same materials as those comprising layer 26. For example, if layer 26 includes GaAs, layer 38 also includes GaAs. However, in accordance with other embodiments of the present invention, layer 38 may include materials different from those used to form layer 26. In accordance with one exemplary embodiment of the invention, layer 38 is about 1 monolayer to about 100 nm thick.

Referring again to FIGS. 1–3, substrate 22 is a monocrystalline substrate such as a monocrystalline silicon substrate. The crystalline structure of the monocrystalline substrate is characterized by a lattice constant and by a lattice orientation. In similar manner, accommodating buffer layer 24 is also a monocrystalline material and the lattice of that monocrystalline material is characterized by a lattice constant and a crystal orientation. The lattice constants of accommodating buffer layer 24 and monocrystalline substrate 22 must be closely matched or, alternatively, must be such that upon rotation of one crystal orientation with respect to the other crystal orientation, a substantial match in lattice constants is achieved. In this context the terms "substantially equal" and "substantially matched" mean that there is sufficient similarity between the lattice constants to permit the growth of a high quality crystalline layer on the underlying layer.

Figure 4:
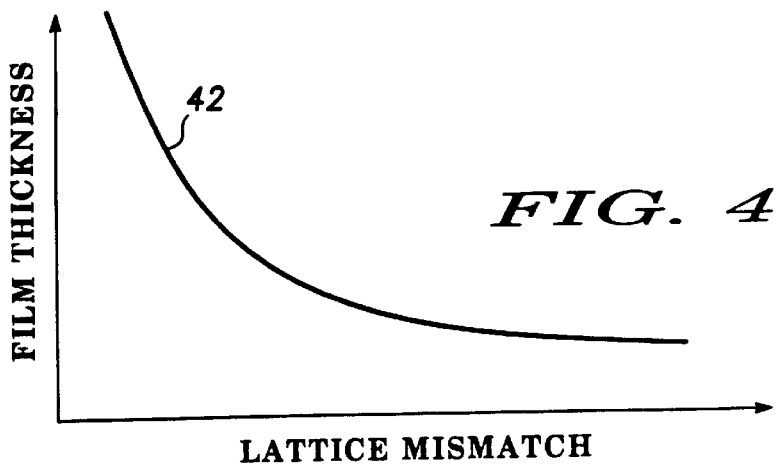
FIG. 4 illustrates graphically the relationship between maximum attainable film thickness and lattice mismatch between a host crystal and a grown crystalline overlayer.

FIG. 4 illustrates graphically the relationship of the achievable thickness of a grown crystal layer of high crystalline quality as a function of the mismatch between the lattice constants of the host crystal and the grown crystal. Curve 42 illustrates the boundary of high crystalline quality material. The area to the right of curve 42 represents layers that tend to be polycrystalline. With no lattice mismatch, it is theoretically possible to grow an infinitely thick, high quality epitaxial layer on the host crystal. As the mismatch in lattice constants increases, the thickness of achievable, high quality crystalline layer decreases rapidly. As a reference point, for example, if the lattice constants between the host crystal and the grown layer are mismatched by more than about 2%, monocrystalline epitaxial layers in excess of about 20 nm cannot be achieved.

In accordance with one embodiment, substrate 22 is a (100) or (111) oriented monocrystalline silicon wafer and accommodating buffer layer 24 is a layer of strontium barium titanate. Substantial matching of lattice constants between these two materials is achieved by rotating the crystal orientation of the titanate material 24 by 45° with respect to the crystal orientation of the silicon substrate wafer 22. The inclusion in the structure of amorphous interface layer 28, a silicon oxide layer in this example, if it is of sufficient thickness, serves to reduce strain in the titanate monocrystalline layer 24 that might result from any mismatch in the lattice constants of the host silicon wafer 22 and the grown titanate layer 24. As a result, a high quality, thick, monocrystalline titanate layer 24 is achievable.

Still referring to FIGS. 1–3, layer 26 is a layer of epitaxially grown monocrystalline material and that crystalline material is also characterized by a crystal lattice constant and a crystal orientation. In accordance with one embodiment of the invention, the lattice constant of layer 26 differs from the lattice constant of substrate 22. To achieve high crystalline quality in this epitaxially grown monocrystalline layer, accommodating buffer layer 24 must be of high crystalline quality. In addition, in order to achieve high crystalline quality in layer 26, substantial matching between the crystal lattice constant of the host crystal, in this case, monocrystalline accommodating buffer layer 24, and grown crystal 26 is desired. With properly selected materials this substantial matching of lattice constants is achieved as a result of rotation of the crystal orientation of grown crystal 26 with respect to the orientation of host crystal 24. If grown crystal 26 is gallium arsenide, aluminum gallium arsenide, zinc selenide, or zinc sulfur selenide and accommodating buffer layer 24 is monocrystalline $Sr_xBa_{1-x}TiO_3$, substantial matching of crystal lattice constants of the two materials is achieved, wherein the crystal orientation of grown layer 26 is rotated by 45° with respect to the orientation of the host monocrystalline oxide 24. Similarly, if host material 24 is a strontium or barium zirconate or a strontium or barium hafnate or barium tin oxide and compound semiconductor layer 26 is indium phosphide or gallium indium arsenide or aluminum indium arsenide, substantial matching of crystal lattice constants can be achieved by rotating the orientation of grown crystal layer 26 by 45° with respect to host oxide crystal 24. In some instances, a crystalline semiconductor buffer layer 32 between host oxide 24 and grown compound semiconductor layer 26 can be used to reduce strain in grown monocrystalline compound semiconductor layer 26 that might result from small differences in lattice constants. Better crystalline quality in grown monocrystalline compound semiconductor layer 26 can thereby be achieved.

The following example illustrates a process, in accordance with one embodiment, for fabricating a semiconductor structure such as the structures depicted in FIGS. 1–3. The process starts by providing a monocrystalline semiconductor substrate 22 comprising silicon or germanium. In accordance with a preferred embodiment, semiconductor substrate 22 is a silicon wafer having a (100) orientation. Substrate 22 is preferably oriented on axis or, at most, about 0.5° off axis. At least a portion of semiconductor substrate 22 has a bare surface, although other portions of the substrate, as described below, may encompass other structures. The term "bare" in this context means that the surface in the portion of substrate 22 has been cleaned to remove any oxides, contaminants, or other foreign material. As is well known, bare silicon is highly reactive and readily forms a native oxide. The term "bare" is intended to encompass such a native oxide. A thin silicon oxide may also be intentionally grown on the semiconductor substrate, although such a grown oxide is not essential to the process. In order to epitaxially grow a monocrystalline oxide layer 24 overlying monocrystaline substrate 22, the native oxide layer must first be removed to expose the crystalline structure of underlying substrate 22. The following process is preferably carried out by molecular beam epitaxy (MBE), although other epitaxial processes may also be used in accordance with the present invention. The native oxide can be removed by first thermally depositing a thin layer of strontium, barium, a combination of strontium and barium, or other alkaline earth metals or combinations of alkaline earth metals in an MBE apparatus. In the case where strontium is used, the substrate 22 is then heated to a temperature of about 750° C. to cause the strontium to react with the native silicon oxide layer. The strontium serves to reduce the silicon oxide to leave a silicon oxide-free surface. The resultant surface, which exhibits an ordered 2×1 structure, includes strontium, oxygen, and silicon. The ordered 2×1 structure forms a template for the ordered growth of an overlying layer 24 of a monocrystalline oxide. The template provides the necessary chemical and physical properties to nucleate the crystalline growth of an overlying layer 24.

In accordance with an alternate embodiment, the native silicon oxide can be converted and the surface of substrate 22 can be prepared for the growth of a monocrystalline oxide layer 24 by depositing an alkaline earth metal oxide, such as strontium oxide or barium oxide, onto the substrate surface by MBE at a low temperature and by subsequently heating the structure to a temperature of about 750° C. At this temperature a solid state reaction takes place between the strontium oxide and the native silicon oxide causing the reduction of the native silicon oxide and leaving an ordered 2×1 structure with strontium, oxygen, and silicon remaining on the substrate 22 surface. Again, this forms a template for the subsequent growth of an ordered monocrystalline oxide layer 24.

Following the removal of the silicon oxide from the surface of substrate 22, the substrate is cooled to a temperature in the range of about 200–800° C. and a layer 24 of strontium titanate is grown on the template layer by molecular beam epitaxy. The MBE process is initiated by opening shutters in the MBE apparatus to expose strontium, titanium and oxygen sources. The ratio of strontium and titanium is approximately 1:1. The partial pressure of oxygen is initially set at a minimum value to grow stoichiometric strontium titanate at a growth rate of about 0.3–0.5 nm per minute. After initiating growth of the strontium titanate, the partial pressure of oxygen is increased above the initial minimum value. The overpressure of oxygen causes the growth of an amorphous silicon oxide layer 28 at the interface between underlying substrate 22 and the growing strontium titanate layer 24. The growth of silicon oxide layer 28 results from the diffusion of oxygen through the growing strontium titanate layer 24 to the interface where the oxygen reacts with silicon at the surface of underlying substrate 22. The strontium titanate grows as an ordered monocrystal 24 with the crystalline orientation rotated by 45° with respect to the ordered 2×1 crystalline structure of underlying substrate 22. Strain that otherwise might exist in strontium titanate layer 24 because of the small mismatch in lattice constant between silicon substrate 22 and the growing crystal 24 is relieved in amorphous silicon oxide intermediate layer 28.

After strontium titanate layer 24 has been grown to the desired thickness, the monocrystalline strontium titanate is capped by a template layer 30 that is conducive to the subsequent growth of an epitaxial layer of a desired compound semiconductor material 26. For the subsequent growth of a layer 26 of gallium arsenide, the MBE growth of strontium titanate monocrystalline layer 24 can be capped by terminating the growth with 1–2 monolayers of titanium, 1–2 monolayers of titanium-oxygen or with 1–2 monolayers of strontium-oxygen. Following the formation of this capping layer, arsenic is deposited to form a Ti—As bond, a Ti—O—As bond or a Sr—O—As bond. Any of these form an appropriate template 30 for deposition and formation of a gallium arsenide monocrystalline layer 26. Following the formation of template 30, gallium is subsequently introduced to the reaction with the arsenic and gallium arsenide 26 forms. Alternatively, gallium can be deposited on the capping layer to form a Sr—O—Ga bond, and arsenic is subsequently introduced with the gallium to form the GaAs.

Figure 5:
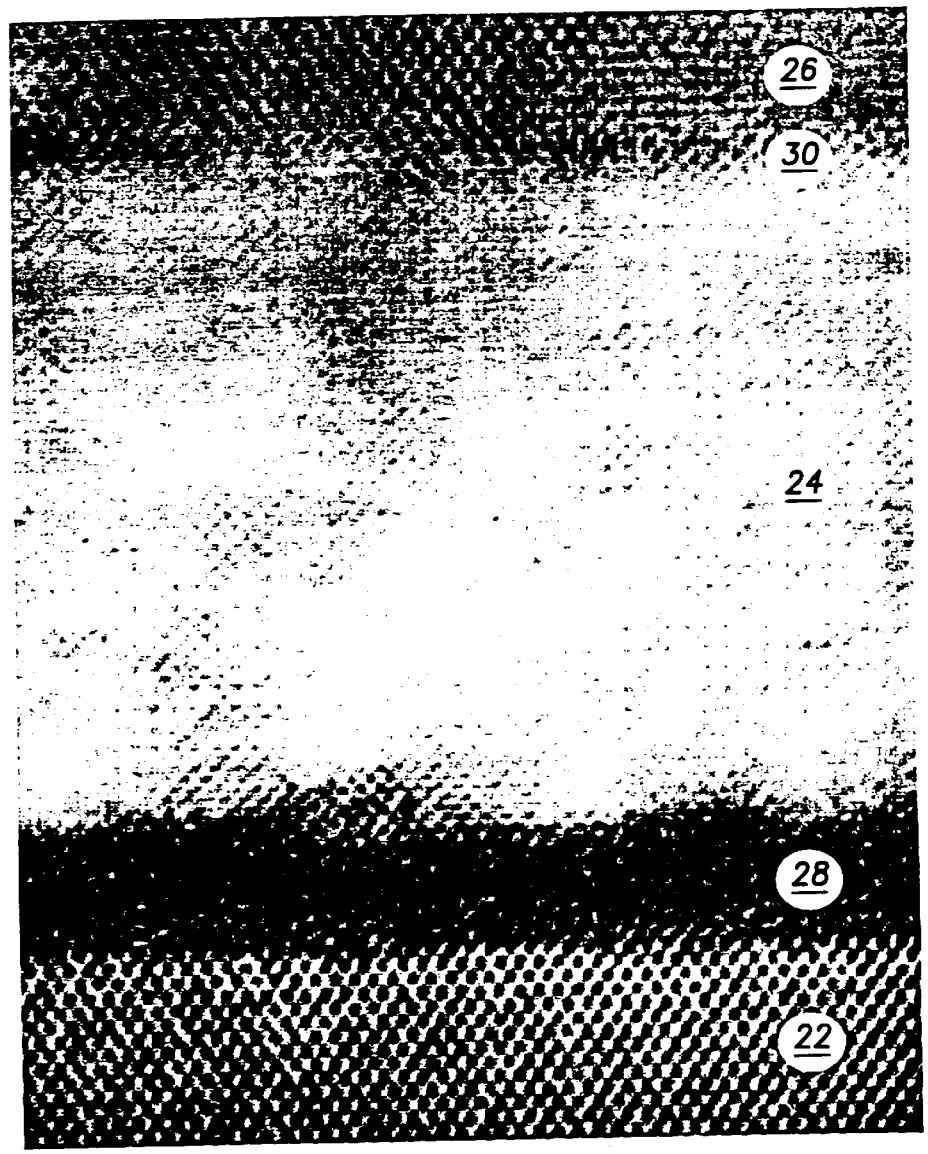
FIG. 5 is a high resolution Transmission Electron Micrograph (TEM) of illustrative semiconductor material manufactured in accordance with what is shown herein.

FIG. 5 is a high resolution Transmission Electron Micrograph (TEM) of semiconductor material manufactured in accordance with the present invention.

Single crystal SrTiO3 accommodating buffer layer 24 was grown epitaxially on silicon substrate 22. During this growth process, amorphous interfacial layer 28 is formed which relieves strain due to lattice mismatch. GaAs compound semiconductor layer 26 was then grown epitaxially using template layer 30.

Figure 6:
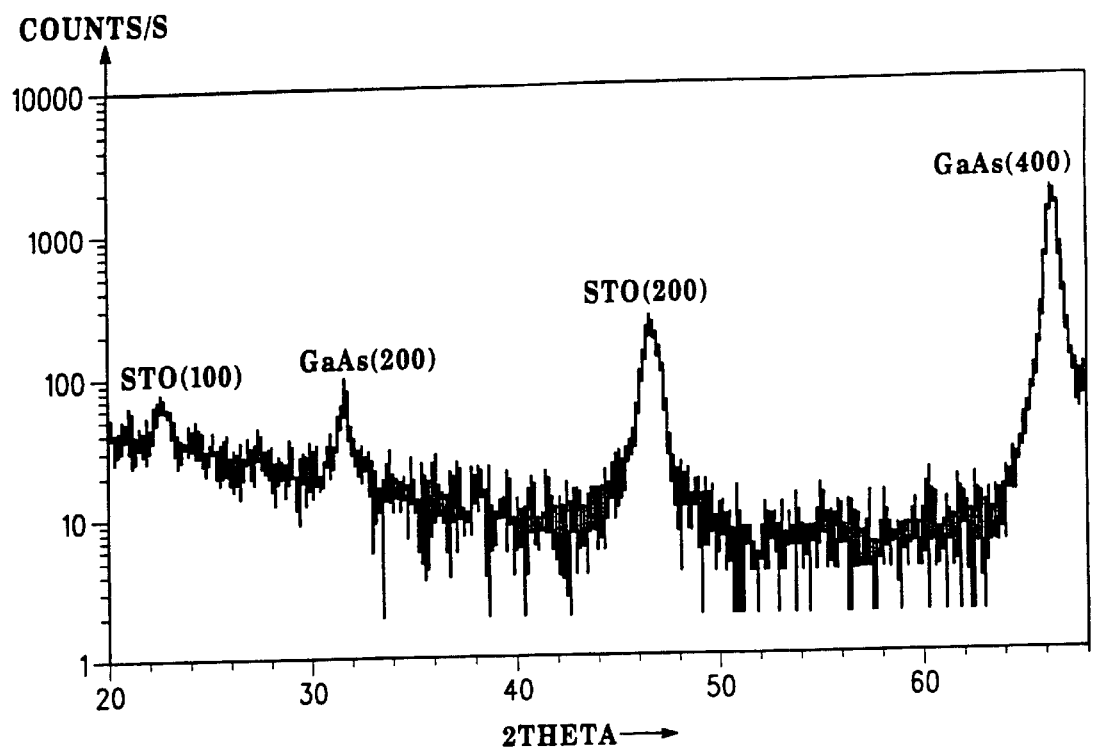
FIG. 6 is an x-ray diffraction taken on an illustrative semiconductor structure manufactured in accordance with what is shown herein.

FIG. 6 illustrates an x-ray diffraction spectrum taken on a structure including GaAs compound semiconductor layer 26 grown on silicon substrate 22 using accommodating buffer layer 24. The peaks in the spectrum indicate that both the accommodating buffer layer 24 and GaAs compound semiconductor layer 26 are single crystal and (100) orientated.

The structure illustrated in FIG. 2 can be formed by the process discussed above with the addition of an additional buffer layer 32 deposition step. The additional buffer layer 32 is formed overlying template layer 30 before the deposition of monocrystalline compound semiconductor layer 26. If buffer layer 32 is a compound semiconductor superlattice, such a superlattice can be deposited, by MBE for example, on the template 30 described above. If instead buffer layer 32 is a layer of germanium, the process above is modified to cap strontium titanate monocrystalline layer 24 with a final layer of either strontium or titanium and then by depositing germanium to react with the strontium or titanium. The germanium buffer layer 32 can then be deposited directly on this template 30.

Structure 34, illustrated in FIG. 3, may be formed by growing an accommodating buffer layer, forming an amorphous oxide layer over substrate 22, and growing semiconductor layer 38 over the accommodating buffer layer, as described above. The accommodating buffer layer and the amorphous oxide layer are then exposed to an anneal process sufficient to change the crystalline structure of the accommodating buffer layer from monocrystalline to amorphous, thereby forming an amorphous layer such that the combination of the amorphous oxide layer and the now amorphous accommodating buffer layer form a single amorphous oxide layer 36. Layer 26 is then subsequently grown over layer 38. Alternatively, the anneal process may be carried out subsequent to growth of layer 26.

In accordance with one aspect of this embodiment, layer 36 is formed by exposing substrate 22, the accommodating buffer layer, the amorphous oxide layer, and semiconductor layer 38 to a rapid thermal anneal process with a peak temperature of about 700° C. to about 100° C. and a process time of about 1 to about 10 minutes. However, other suitable anneal processes may be employed to convert the accommodating buffer layer to an amorphous layer in accordance with the present invention. For example, laser annealing or "conventional" thermal annealing processes (in the proper environment) may be used to form layer 36. When conventional thermal annealing is employed to form layer 36, an overpressure of one or more constituents of layer 30 may be required to prevent degradation of layer 38 during the anneal process. For example, when layer 38 includes GaAs, the anneal environment preferably includes an overpressure of arsenic to mitigate degradation of layer 38.

As noted above, layer 38 of structure 34 may include any materials suitable for either of layers 32 or 26. Accordingly, any deposition or growth methods described in connection with either layer 32 or 26, may be employed to deposit layer 38.

Figure 7:
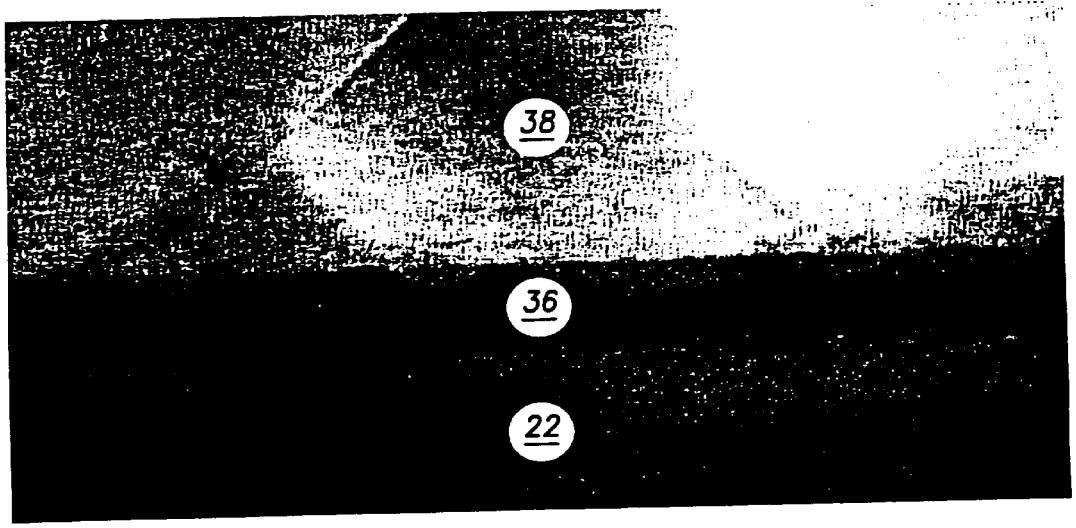
FIG. 7 illustrates a high resolution Transmission Electron Micrograph of a structure including an amorphous oxide layer.

FIG. 7 is a high resolution Transmission Electron Micrograph (TEM) of semiconductor material manufactured in accordance with the embodiment of the invention illustrated in FIG. 3. In accordance with this embodiment, a single crystal SrTiO3 accommodating buffer layer was grown epitaxially on silicon substrate 22. During this growth process, an amorphous interfacial layer forms as described above. Next, GaAs layer 38 is formed above the accommodating buffer layer and the accommodating buffer layer is exposed to an anneal process to form amorphous oxide layer 36.

Figure 8:
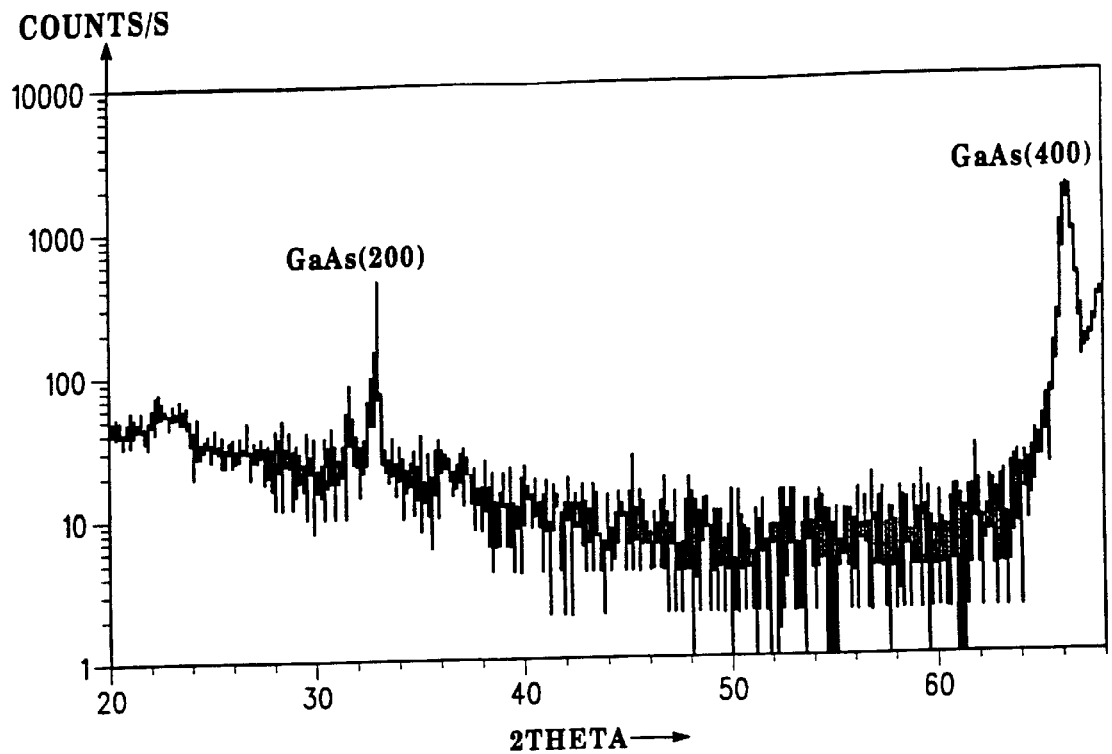
FIG. 8 illustrates an x-ray diffraction spectrum of a structure including an amorphous oxide layer.

FIG. 8 illustrates an x-ray diffraction spectrum taken on a structure including GaAs compound semiconductor layer 38 and amorphous oxide layer 36 formed on silicon substrate 22. The peaks in the spectrum indicate that GaAs compound semiconductor layer 38 is single crystal and (100) orientated and the lack of peaks around 40 to 50 degrees indicates that layer 36 is amorphous.

The process described above illustrates a process for forming a semiconductor structure including a silicon substrate 22, an overlying oxide layer, and a monocrystalline gallium arsenide compound semiconductor layer 26 by the process of molecular beam epitaxy. The process can also be carried out by the process of chemical vapor deposition (CVD), metal organic chemical vapor deposition (MOCVD), migration enhanced epitaxy (MEE), atomic layer epitaxy (ALE), physical vapor deposition (PVD), chemical solution deposition (CSD), pulsed laser deposition (PLD), or the like. Further, by a similar process, other monocrystalline accommodating buffer layers 24 such as alkaline earth metal titanates, zirconates, hafnates, tantalates, vanadates, ruthenates, and niobates, alkaline earth metal tin-based perovskites, lanthanum aluminate, lanthanum scandium oxide, and gadolinium oxide can also be grown. Further, by a similar process such as MBE, other III–V and II–VI monocrystalline compound semiconductor layers 26 can be deposited overlying monocrystalline oxide accommodating buffer layer 24.

Each of the variations of compound semiconductor materials 26 and monocrystalline oxide accommodating buffer layer 24 uses an appropriate template 30 for initiating the growth of the compound semiconductor layer. For example, if accommodating buffer layer 24 is an alkaline earth metal zirconate, the oxide can be capped by a thin layer of zirconium. The deposition of zirconium can be followed by the deposition of arsenic or phosphorus to react with the zirconium as a precursor to depositing indium gallium arsenide, indium aluminum arsenide, or indium phosphide respectively. Similarly, if monocrystalline oxide accommodating buffer layer 24 is an alkaline earth metal hafnate, the oxide layer can be capped by a thin layer of hafnium. The deposition of hafnium is followed by the deposition of arsenic or phosphorous to react with the hafnium as a precursor to the growth of an indium gallium arsenide, indium aluminum arsenide, or indium phosphide layer 26, respectively. In a similar manner, strontium titanate 24 can be capped with a layer of strontium or strontium and oxygen, and barium titanate 24 can be capped with a layer of barium or barium and oxygen. Each of these depositions can be followed by the deposition of arsenic or phosphorus to react with the capping material to form a template 30 for the deposition of a compound semiconductor material layer 26 comprising indium gallium arsenide, indium aluminum arsenide, or indium phosphide.

Figure 9:
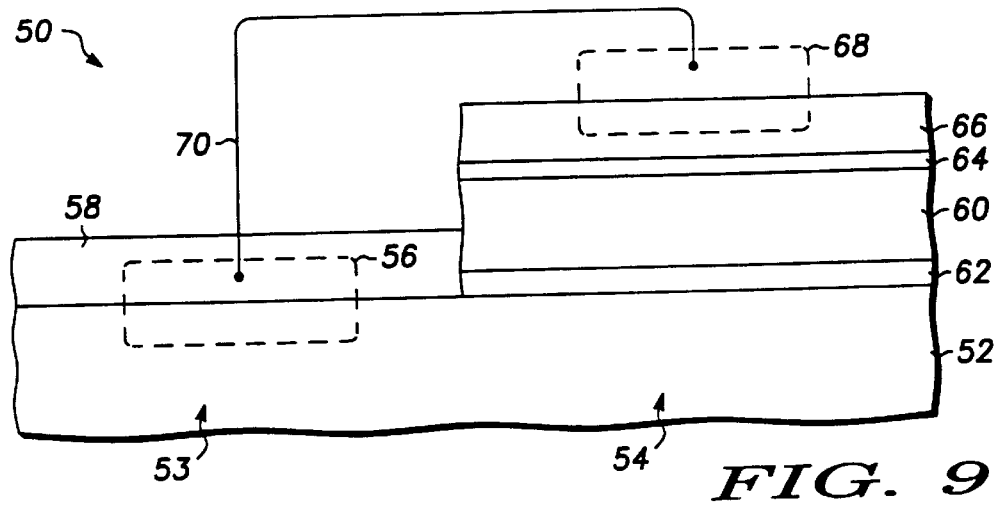

FIG. 9 illustrates schematically, in cross section, a device structure 50 in accordance with a further embodiment. Device structure 50 includes a monocrystalline semiconductor substrate 52, preferably a monocrystalline silicon wafer. Monocrystalline semiconductor substrate 52 includes two regions, 53 and 54. An electrical semiconductor component generally indicated by the dashed line 56 is formed, at least partially, in region 53. Electrical component 56 can be a resistor, a capacitor, an active semiconductor component such as a diode or a transistor or an integrated circuit such as a CMOS integrated circuit. For example, electrical semiconductor component 56 can be a CMOS integrated circuit configured to perform digital signal processing or another function for which silicon integrated circuits are well suited. The electrical semiconductor component in region 53 can be formed by conventional semiconductor processing as well known and widely practiced in the semiconductor industry. A layer of insulating material 58 such as a layer of silicon dioxide or the like may overlie electrical semiconductor component 56.

Insulating material 58 and any other layers that may have been formed or deposited during the processing of semiconductor component 56 in region 53 are removed from the surface of region 54 to provide a bare silicon surface in that region. As is well known, bare silicon surfaces are highly reactive and a native silicon oxide layer can quickly form on the bare surface. A layer of barium or barium and oxygen is deposited onto the native oxide layer on the surface of region 54 and is reacted with the oxidized surface to form a first template layer (not shown). In accordance with one embodiment, a monocrystalline oxide layer 60 is formed overlying the template layer by a process of molecular beam epitaxy. Reactants including barium, titanium and oxygen are deposited onto the template layer to form the monocrystalline oxide layer 60. Initially during the deposition the partial pressure of oxygen is kept near the minimum necessary to fully react with the barium and titanium to form monocrystalline barium titanate layer. The partial pressure of oxygen is then increased to provide an overpressure of oxygen and to allow oxygen to diffuse through the growing monocrystalline oxide layer. The oxygen diffusing through the barium titanate reacts with silicon at the surface of region 54 to form an amorphous layer of silicon oxide 62 on second region 54 and at the interface between silicon substrate 52 and the monocrystalline oxide layer 60. Layers 60 and 62 may be subject to an annealing process as described above in connection with FIG. 3 to form a single amorphous accommodating layer.

In accordance with an embodiment, the step of depositing the monocrystalline oxide layer is terminated by depositing a second template layer 60, which can be 1–10 monolayers of titanium, barium, barium and oxygen, or titanium and oxygen. A layer 66 of a monocrystalline compound semiconductor material is then deposited overlying second template layer 64 by a process of molecular beam epitaxy. The deposition of layer 66 is initiated by depositing a layer of arsenic onto template 64. This initial step is followed by depositing gallium and arsenic to form monocrystalline gallium arsenide 66. Alternatively, strontium can be substituted for barium in the above example.

In accordance with a further embodiment, a semiconductor component, generally indicated by a dashed line 68 is formed in compound semiconductor layer 66. Semiconductor component 68 can be formed by processing steps conventionally used in the fabrication of gallium arsenide or other III–V compound semiconductor material devices. Semiconductor component 68 can be any active or passive component, and preferably is a semiconductor laser, light emitting diode, photodetector, heterojunction bipolar transistor (HBT), high frequency MESFET, or other component that utilizes and takes advantage of the physical properties of compound semiconductor materials. A metallic conductor schematically indicated by the line 70 can be formed to electrically couple device 68 and device 56, thus implementing an integrated device that includes at least one component formed in silicon substrate 52 and one device formed in monocrystalline compound semiconductor material layer 66. Although illustrative structure 50 has been described as a structure formed on a silicon substrate 52 and having a barium (or strontium) titanate layer 60 and a gallium arsenide layer 66, similar devices can be fabricated using other substrates, monocrystalline oxide layers and other compound semiconductor layers as described elsewhere in this disclosure.

Figure 10:
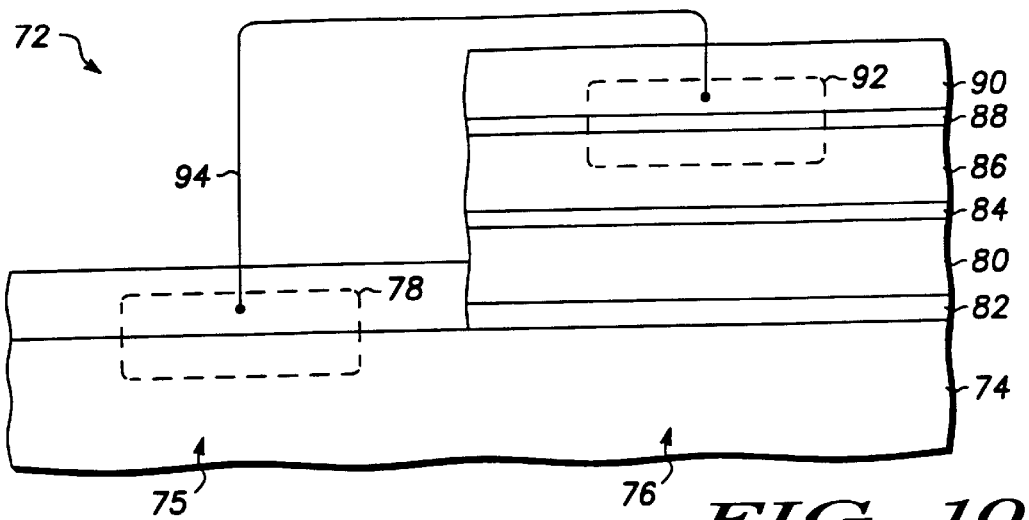

FIG. 10 illustrates a semiconductor structure 72 in accordance with a further embodiment. Structure 72 includes a monocrystalline semiconductor substrate 74 such as a monocrystalline silicon wafer that includes a region 75 and a region 76. An electrical component schematically illustrated by the dashed line 78 is formed in region 75 using conventional silicon device processing techniques commonly used in the semiconductor industry. Using process steps similar to those described above, a monocrystalline oxide layer 80 and an intermediate amorphous silicon oxide layer 82 are formed overlying region 76 of substrate 74. A template layer 84 and subsequently a monocrystalline semiconductor layer 86 are formed overlying monocrystalline oxide layer 80. In accordance with a further embodiment, an additional monocrystalline oxide layer 88 is formed overlying layer 86 by process steps similar to those used to form layer 80, and an additional monocrystalline semiconductor layer 90 is formed overlying monocrystalline oxide layer 88 by process steps similar to those used to form layer 86. In accordance with one embodiment, at least one of layers 86 and 90 are formed from a compound semiconductor material. Layers 80 and 82 may be subject to an annealing process as described above in connection with FIG. 3 to form a single amorphous accommodating layer.

A semiconductor component generally indicated by a dashed line 92 is formed at least partially in monocrystalline semiconductor layer 86. In accordance with one embodiment, semiconductor component 92 may include a field effect transistor having a gate dielectric formed, in part, by monocrystalline oxide layer 88. In addition, monocrystalline semiconductor layer 90 can be used to implement the gate electrode of that field effect transistor. In accordance with one embodiment, monocrystalline semiconductor layer 86 is formed from a group III–V compound and semiconductor component 92 is a radio frequency amplifier that takes advantage of the high mobility characteristic of group III–V component materials. In accordance with yet a further embodiment, an electrical interconnection schematically illustrated by the line 94 electrically interconnects component 78 and component 92. Structure 72 thus integrates components that take advantage of the unique properties of the two monocrystalline semiconductor materials.

Figure 11:
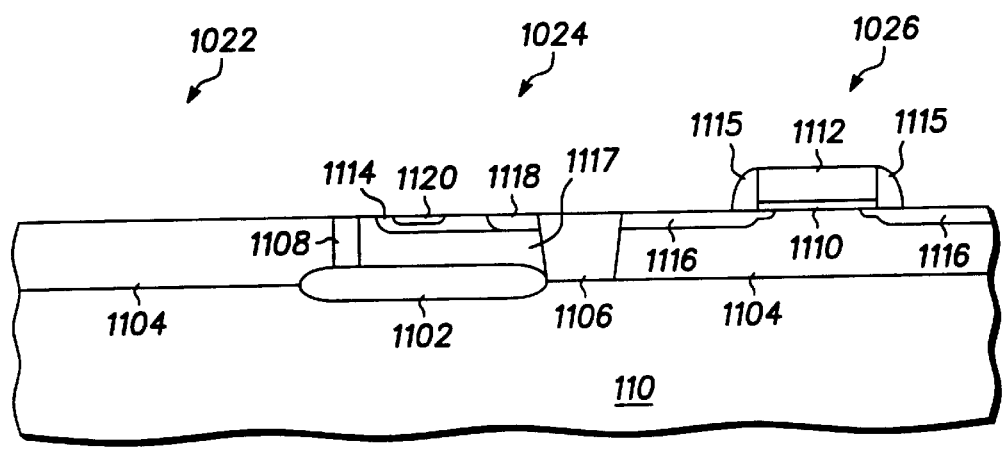
FIGS. 11–15 include illustrations of cross-sectional views of a portion of an integrated circuit that includes a compound semiconductor portion, a bipolar portion, and an MOS portion in accordance with what is shown herein.

Attention is now directed to a method for forming exemplary portions of illustrative composite semiconductor structures or composite integrated circuits like 50 or 72. In particular, the illustrative composite semiconductor structure or integrated circuit 102 shown in FIGS. 11–15 includes a compound semiconductor portion 1022, a bipolar portion 1024, and a MOS portion 1026. In FIG. 11, a p-type doped, monocrystalline silicon substrate 110 is provided having a compound semiconductor portion 1022, a bipolar portion 1024, and an MOS portion 1026. Within bipolar portion 1024, the monocrystalline silicon substrate 110 is doped to form an N$^+$ buried region 1102. A lightly p-type doped epitaxial monocrystalline silicon layer 1104 is then formed over the buried region 1102 and the substrate 110. A doping step is then performed to create a lightly n-type doped drift region 1117 above the N$^+$ buried region 1102. The doping step converts the dopant type of the lightly p-type epitaxial layer within a section of the bipolar region 1024 to a lightly n-type monocrystalline silicon region. A field isolation region 1106 is then formed between the bipolar portion 1024 and the MOS portion 1026. A gate dielectric layer 1110 is formed over a portion of the epitaxial layer 1104 within MOS portion 1026, and the gate electrode 1112 is then formed over the gate dielectric layer 1110. Sidewall spacers 1115 are formed along vertical sides of the gate electrode 1112 and gate dielectric layer 1110.

A p-type dopant is introduced into the drift region 1117 to form an active or intrinsic base region 1114. An n-type, deep collector region 1108 is then formed within the bipolar portion 1024 to allow electrical connection to the buried region 1102. Selective n-type doping is performed to form N$^+$ doped regions 1116 and the emitter region 1120. N$^+$ doped regions 1116 are formed within layer 1104 along adjacent sides of the gate electrode 1112 and are source, drain, or source/drain regions for the MOS transistor. The N$^+$ doped regions 1116 and emitter region 1120 have a doping concentration of at least 1E19 atoms per cubic centimeter to allow ohmic contacts to be formed. A p-type doped region is formed to create the inactive or extrinsic base region 1118 which is a P$^+$ doped region (doping concentration of at least 1E19 atoms per cubic centimeter).

In the embodiment described, several processing steps have been performed but are not illustrated or further described, such as the formation of well regions, threshold adjusting implants, channel punchthrough prevention implants, field punchthrough prevention implants, as well as a variety of masking layers. The formation of the device up to this point in the process is performed using conventional steps. As illustrated, a standard N-channel MOS transistor has been formed within the MOS region 1026, and a vertical NPN bipolar transistor has been formed within the bipolar portion 1024. As of this point, no circuitry has been formed within the compound semiconductor portion 1022.

All of the layers that have been formed during the processing of the bipolar and MOS portions of the integrated circuit are now removed from the surface of compound semiconductor portion 1022. A bare silicon surface is thus provided for the subsequent processing of this portion, for example in the manner set forth above.

Figure 12:
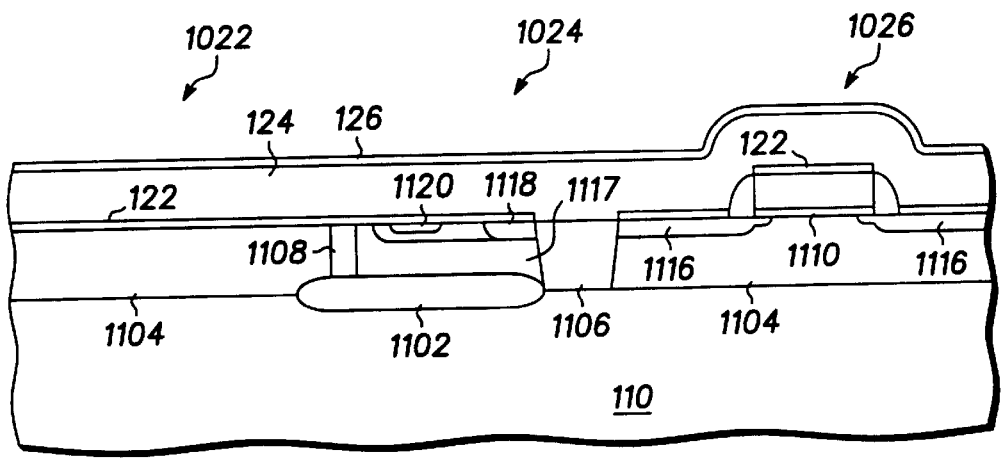
Figure 13:
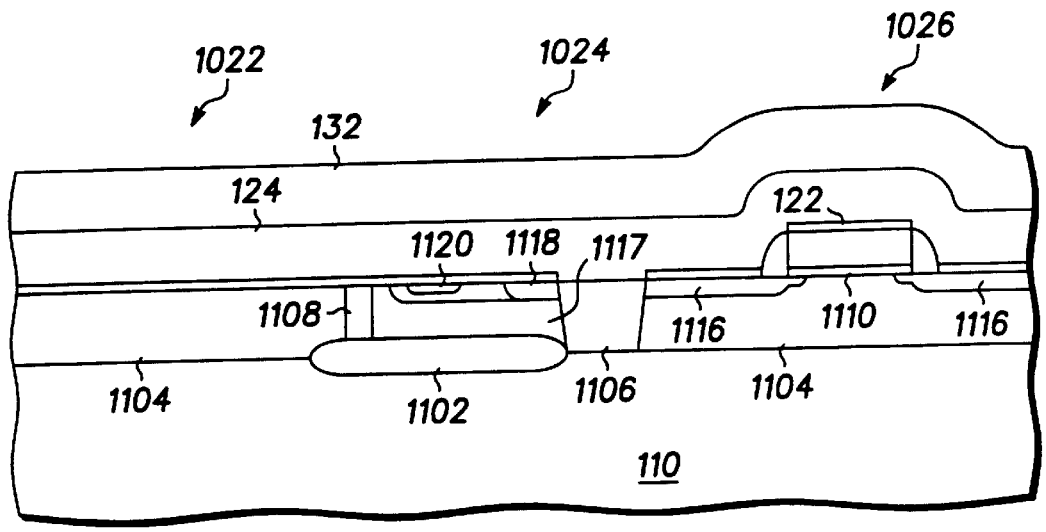

An accommodating buffer layer 124 is then formed over the substrate 110 as illustrated in FIG. 12. The accommodating buffer layer will form as a monocrystalline layer over the properly prepared (i.e., having the appropriate template layer) bare silicon surface in portion 1022. The portion of layer 124 that forms over portions 1024 and 1026, however, may be polycrystalline or amorphous because it is formed over a material that is not monocrystalline, and therefore, does not nucleate monocrystalline growth. The accommodating buffer layer 124 typically is a monocrystalline metal oxide or nitride layer and typically has a thickness in a range of approximately 2–100 nanometers. In one particular embodiment, the accommodating buffer layer is approximately 5–15 nm thick. During the formation of the accommodating buffer layer, an amorphous intermediate layer 122 is formed along the uppermost silicon surfaces of the integrated circuit 102. This amorphous intermediate layer 122 typically includes an oxide of silicon and has a thickness and range of approximately 1–5 nm. In one particular embodiment, the thickness is approximately 2 nm. Following the formation of the accommodating buffer layer 124 and the amorphous intermediate layer 122, a template layer 126 is then formed and has a thickness in a range of approximately one to ten monolayers of a material. In one particular embodiment, the material includes titanium-arsenic, strontium-oxygen-arsenic, or other similar materials as previously described with respect to FIGS. 1–5. Layers 122 and 124 may be subject to an annealing process as described above in connection with FIG. 3 to form a single amorphous accommodating layer.

A monocrystalline compound semiconductor layer 132 is then epitaxially grown overlying the monocrystalline portion of accommodating buffer layer 124 (or over the amorphous accommodating layer if the annealing process described above has been carried out) as shown in FIG. 13. The portion of layer 132 that is grown over portions of layer 124 that are not monocrystalline may be polycrystalline or amorphous. The monocrystalline compound semiconductor layer can be formed by a number of methods and typically includes a material such as gallium arsenide, aluminum gallium arsenide, indium phosphide, or other compound semiconductor materials as previously mentioned. The thickness of the layer is in a range of approximately 1–5,000 nm, and more preferably 100–500 nm. In this particular embodiment, each of the elements within the template layer are also present in the accommodating buffer layer 124, the monocrystalline compound semiconductor material 132, or both. Therefore, the delineation between the template layer 126 and its two immediately adjacent layers disappears during processing. Therefore, when a transmission electron microscopy (TEM) photograph is taken, an interface between the accommodating buffer layer 124 and the monocrystalline compound semiconductor layer 132 is seen.

Figure 14:
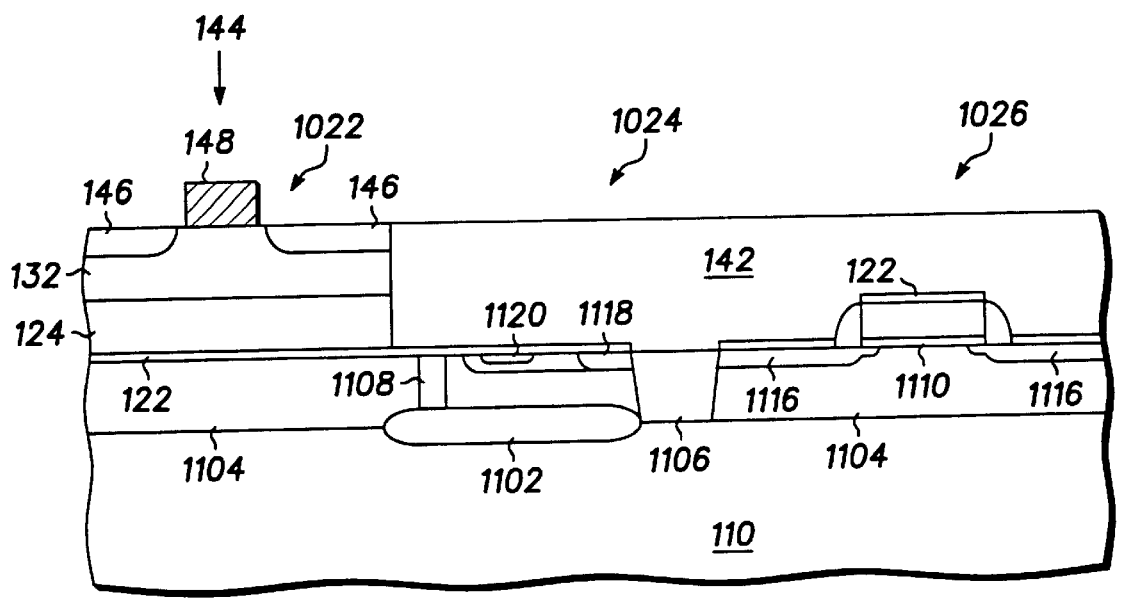

At this point in time, sections of the compound semiconductor layer 132 and the accommodating buffer layer 124 (or of the amorphous accommodating layer if the annealing process described above has been carried out) are removed from portions overlying the bipolar portion 1024 and the MOS portion 1026 as shown in FIG. 14. After the section is removed, an insulating layer 142 is then formed over the substrate 110. The insulating layer 142 can include a number of materials such as oxides, nitrides, oxynitrides, low-k dielectrics, or the like. As used herein, low-k is a material having a dielectric constant no higher than approximately 3.5. After the insulating layer 142 has been deposited, it is then polished, removing portions of the insulating layer 142 that overlie monocrystalline compound semiconductor layer 132.

A transistor 144 is then formed within the monocrystalline compound semiconductor portion 1022. A gate electrode 148 is then formed on the monocrystalline compound semiconductor layer 132. Doped regions 146 are then formed within the monocrystalline compound semiconductor layer 132. In this embodiment, the transistor 144 is a metal-semiconductor field-effect transistor (MESFET). If the MESFET is an n-type MESFET, the doped regions 146 and monocrystalline compound semiconductor layer 132 are also n-type doped. If a p-type MESFET were to be formed, then the doped regions 146 and monocrystalline compound semiconductor layer 132 would have just the opposite doping type. The heavier doped (N$^+$) regions 146 allow ohmic contacts to be made to the monocrystalline compound semiconductor layer 132. At this point in time, the active devices within the integrated circuit have been formed. This particular embodiment includes an n-type MESFET, a vertical NPN bipolar transistor, and a planar n-channel MOS transistor. Many other types of transistors, including P-channel MOS transistors, p-type vertical bipolar transistors, p-type MESFETs, and combinations of vertical and planar transistors, can be used. Also, other electrical components, such as resistors, capacitors, diodes, and the like, may be formed in one or more of the portions 1022, 1024, and 1026.

Figure 15:
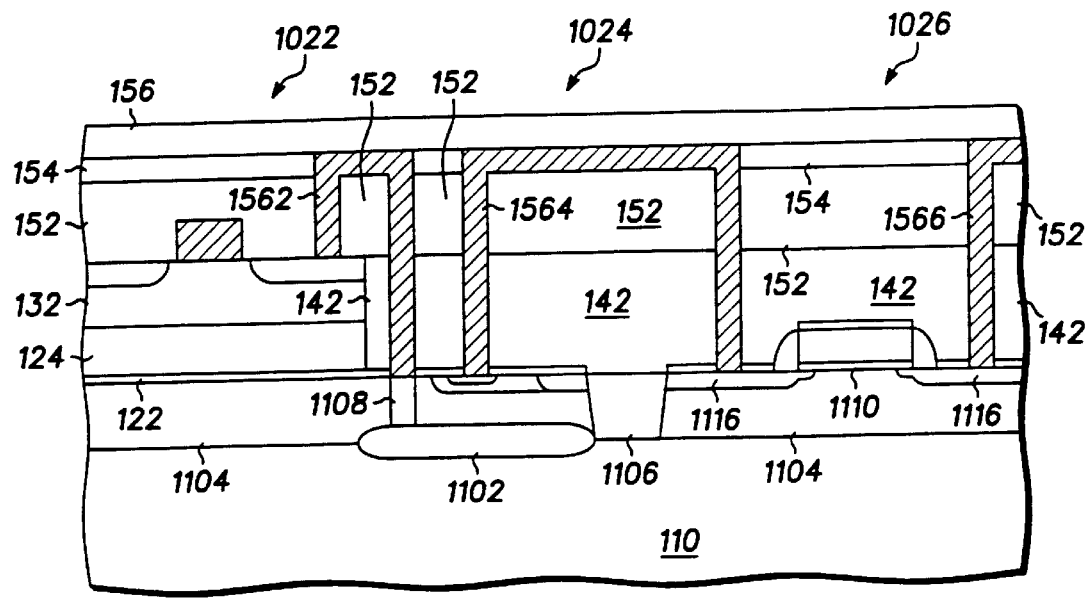

Processing continues to form a substantially completed integrated circuit 102 as illustrated in FIG. 15. An insulating layer 152 is formed over the substrate 110. The insulating layer 152 may include an etch-stop or polish-stop region that is not illustrated in FIG. 15. A second insulating layer 154 is then formed over the first insulating layer 152. Portions of layers 154, 152, 142, 124, and 122 are removed to define contact openings where the devices are to be interconnected. Interconnect trenches are formed within insulating layer 154 to provide the lateral connections between the contacts. As illustrated in FIG. 15, interconnect 1562 connects a source or drain region of the n-type MESFET within portion 1022 to the deep collector region 1108 of the NPN transistor within the bipolar portion 1024. The emitter region 1120 of the NPN transistor is connected to one of the doped regions 1116 of the n-channel MOS transistor within the MOS portion 1026. The other doped region 1116 is electrically connected to other portions of the integrated circuit that are not shown.

A passivation layer 156 is formed over the interconnects 1562, 1564, and 1566 and insulating layer 154. Other electrical connections are made to the transistors as illustrated as well as to other electrical or electronic components within the integrated circuit 102 but are not illustrated in the FIGS. Further, additional insulating layers and interconnects may be formed as necessary to form the proper interconnections between the various components within the integrated circuit 102.

As can be seen from the previous embodiment, active devices for both compound semiconductor and Group IV semiconductor materials can be integrated into a single integrated circuit. Because there is some difficulty in incorporating both bipolar transistors and MOS transistors within a same integrated circuit, it may be possible to move some of the components within bipolar portion into the compound semiconductor portion 1022 or the MOS portion 1024. Therefore, the requirement of special fabricating steps solely used for making a bipolar transistor can be eliminated. Therefore, there would only be a compound semiconductor portion and a MOS portion to the integrated circuit.

In still another embodiment, an integrated circuit can be formed such that it includes an optical laser in a compound semiconductor portion and an optical interconnect (waveguide) to a MOS transistor within a Group IV semiconductor region of the same integrated circuit. FIGS. 16–22 include illustrations of one embodiment.

Figure 16:
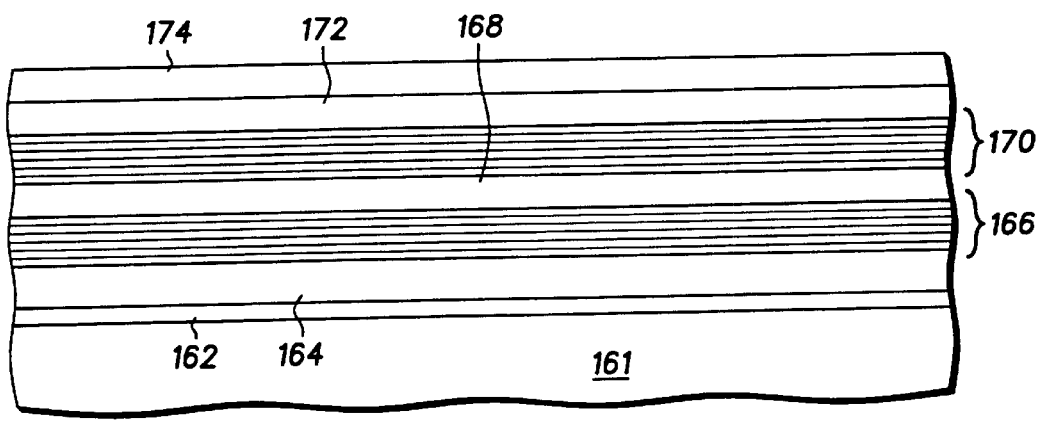
FIGS. 16–22 include illustrations of cross-sectional views of a portion of another integrated circuit that includes a semiconductor laser and a MOS transistor in accordance with what is shown herein.

FIG. 16 includes an illustration of a cross-section view of a portion of an integrated circuit 160 that includes a monocrystalline silicon wafer 161. An amorphous intermediate layer 162 and an accommodating buffer layer 164, similar to those previously described, have been formed over wafer 161. Layers 162 and 164 may be subject to an annealing process as described above in connection with FIG. 3 to form a single amorphous accommodating layer. In this specific embodiment, the layers needed to form the optical laser will be formed first, followed by the layers needed for the MOS transistor. In FIG. 16, the lower mirror layer 166 includes alternating layers of compound semiconductor materials. For example, the first, third, and fifth films within the optical laser may include a material such as gallium arsenide, and the second, fourth, and sixth films within the lower mirror layer 166 may include aluminum gallium arsenide or vice versa. Layer 168 includes the active region that will be used for photon generation. Upper mirror layer 170 is formed in a similar manner to the lower mirror layer 166 and includes alternating films of compound semiconductor materials. In one particular embodiment, the upper mirror layer 170 may be p-type doped compound semiconductor materials, and the lower mirror layer 166 may be n-type doped compound semiconductor materials.

Another accommodating buffer layer 172, similar to the accommodating buffer layer 164, is formed over the upper mirror layer 170. In an alternative embodiment, the accommodating buffer layers 164 and 172 may include different materials. However, their function is essentially the same in that each is used for making a transition between a compound semiconductor layer and a monocrystalline Group IV semiconductor layer. Layer 172 may be subject to an annealing process as described above in connection with FIG. 3 to form an amorphous accommodating layer. A monocrystalline Group IV semiconductor layer 174 is formed over the accommodating buffer layer 172. In one particular embodiment, the monocrystalline Group IV semiconductor layer 174 includes germanium, silicon germanium, silicon germanium carbide, or the like.

Figure 17:
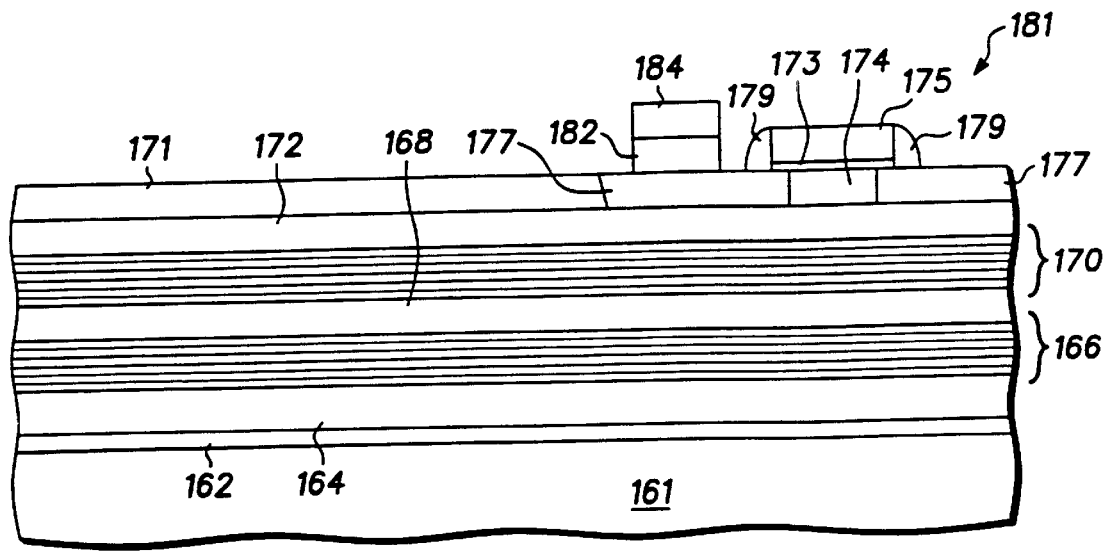

In FIG. 17, the MOS portion is processed to form electrical components within this upper monocrystalline Group IV semiconductor layer 174. As illustrated in FIG. 17, a field isolation region 171 is formed from a portion of layer 174. A gate dielectric layer 173 is formed over the layer 174, and a gate electrode 175 is formed over the gate dielectric layer 173. Doped regions 177 are source, drain, or source/drain regions for the transistor 181, as shown. Sidewall spacers 179 are formed adjacent to the vertical sides of the gate electrode 175. Other components can be made within at least a part of layer 174. These other components include other transistors (n-channel or p-channel), capacitors, transistors, diodes, and the like.

A monocrystalline Group IV semiconductor layer is epitaxially grown over one of the doped regions 177. An upper portion 184 is P+ doped, and a lower portion 182 remains substantially intrinsic (undoped) as illustrated in FIG. 17. The layer can be formed using a selective epitaxial process. In one embodiment, an insulating layer (not shown) is formed over the transistor 181 and the field isolation region 171. The insulating layer is patterned to define an opening that exposes one of the doped regions 177. At least initially, the selective epitaxial layer is formed without dopants. The entire selective epitaxial layer may be intrinsic, or a p-type dopant can be added near the end of the formation of the selective epitaxial layer. If the selective epitaxial layer is intrinsic, as formed, a doping step may be formed by implantation or by furnace doping. Regardless how the P+ upper portion 184 is formed, the insulating layer is then removed to form the resulting structure shown in FIG. 17.

Figure 18:
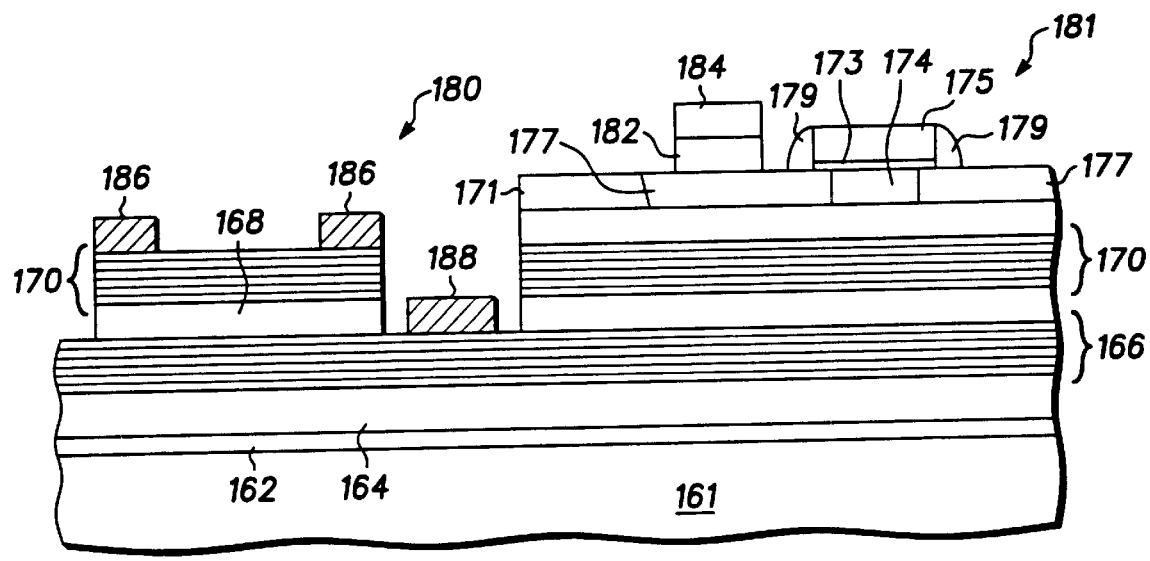

The next set of steps is performed to define the optical laser 180 as illustrated in FIG. 18. The field isolation region 171 and the accommodating buffer layer 172 are removed over the compound semiconductor portion of the integrated circuit. Additional steps are performed to define the upper mirror layer 170 and active layer 168 of the optical laser 180. The sides of the upper mirror layer 170 and active layer 168 are substantially coterminous.

Contacts 186 and 188 are formed for making electrical contact to the upper mirror layer 170 and the lower mirror layer 166, respectively, as shown in FIG. 18. Contact 186 has an annular shape to allow light (photons) to pass out of the upper mirror layer 170 into a subsequently formed optical waveguide.

Figure 19:
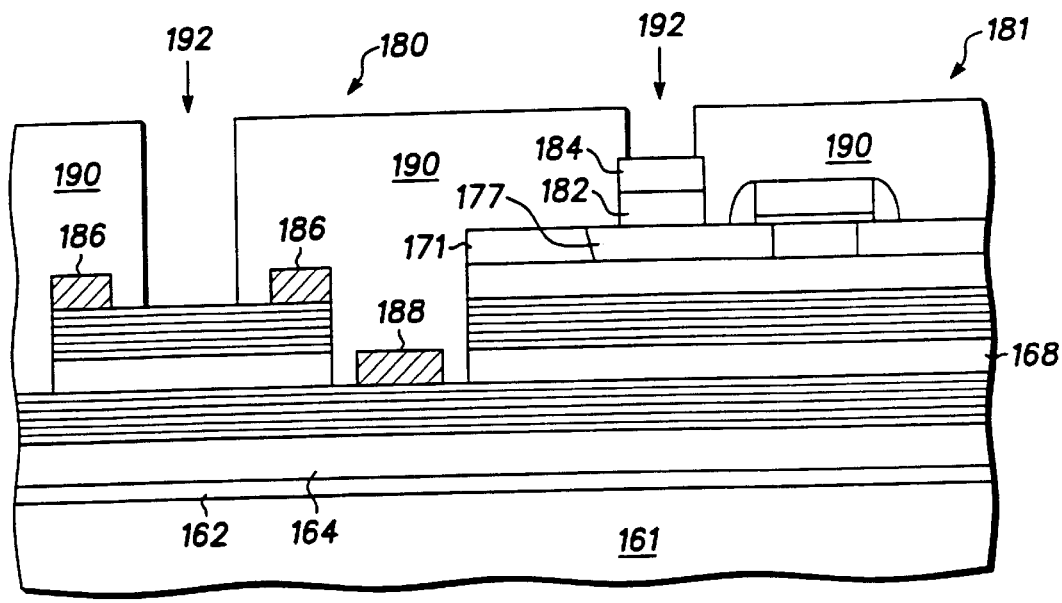
Figure 20:
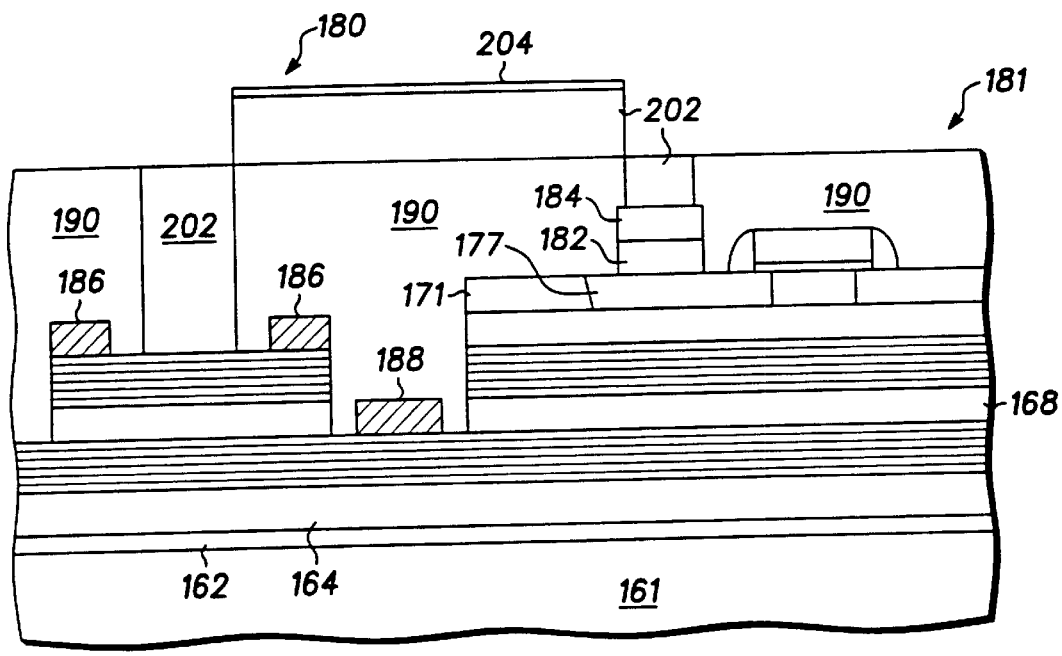

An insulating layer 190 is then formed and patterned to define optical openings extending to the contact layer 186 and one of the doped regions 177 as shown in FIG. 19. The insulating material can be any number of different materials, including an oxide, nitride, oxynitride, low-k dielectric, or any combination thereof. After defining the openings 192, a higher refractive index material 202 is then formed within the openings to fill them and to deposit the layer over the insulating layer 190 as illustrated in FIG. 20. With respect to the higher refractive index material 202, "higher" is in relation to the material of the insulating layer 190 (i.e., material 202 has a higher refractive index compared to the insulating layer 190). Optionally, a relatively thin lower refractive index film (not shown) could be formed before forming the higher refractive index material 202. A hard mask layer 204 is then formed over the high refractive index layer 202. Portions of the hard mask layer 204, and high refractive index layer 202 are removed from portions overlying the opening and to areas closer to the sides of FIG. 15.

Figure 21:
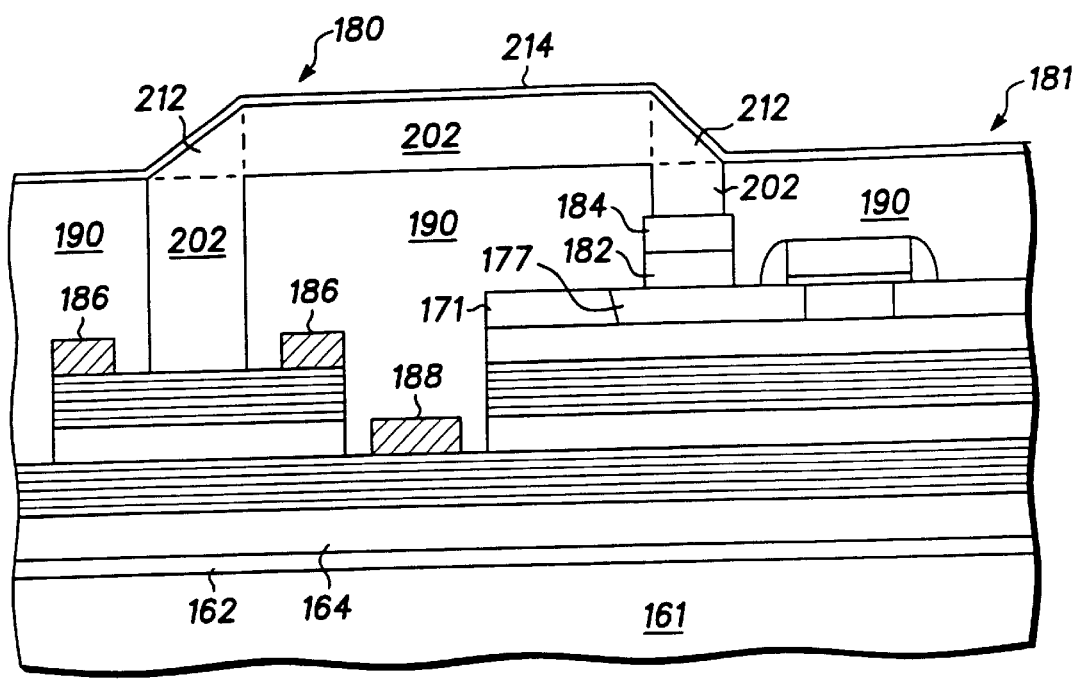

The balance of the formation of the optical waveguide, which is an optical interconnect, is completed as illustrated in FIG. 21. A deposition procedure (possibly a dep-etch process) is performed to effectively create sidewalls sections 212. In this embodiment, the sidewall sections 212 are made of the same material as material 202. The hard mask layer 204 is then removed, and a low refractive index layer 214 (low relative to material 202 and layer 212) is formed over the higher refractive index material 212 and 202 and exposed portions of the insulating layer 190. The dash lines in FIG. 21 illustrate the border between the high refractive index materials 202 and 212. This designation is used to identify that both are made of the same material but are formed at different times.

Figure 22:
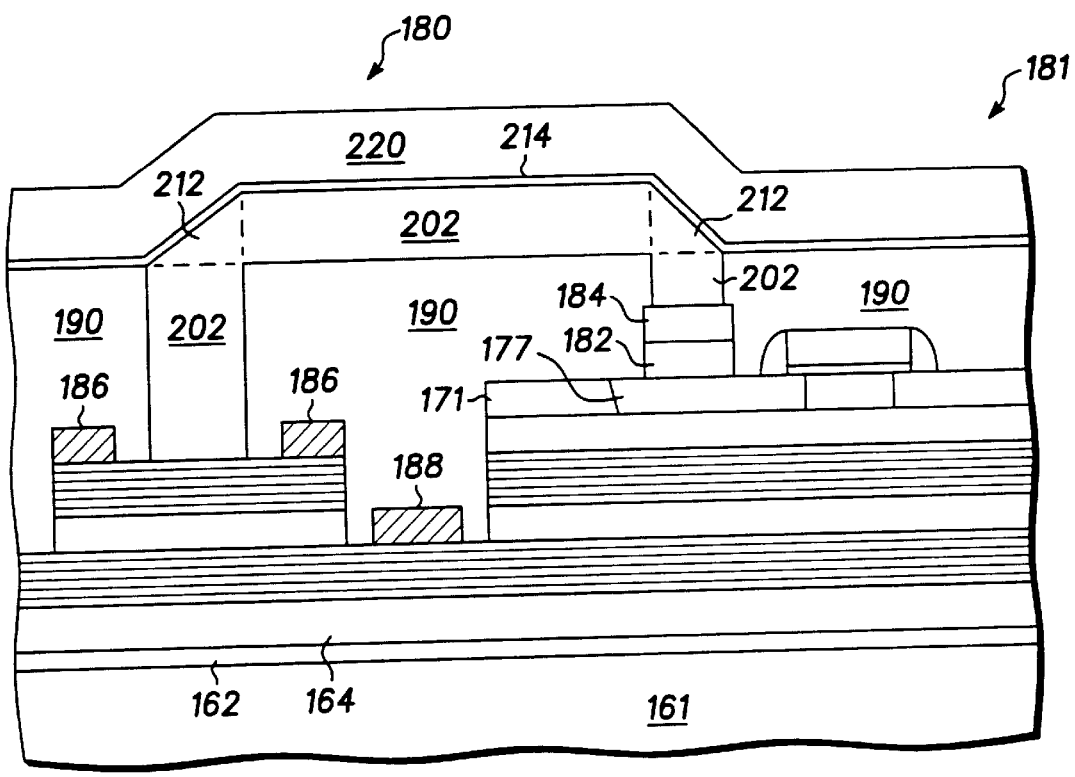

Processing is continued to form a substantially completed integrated circuit as illustrated in FIG. 22. A passivation layer 220 is then formed over the optical laser 180 and MOSFET transistor 181. Although not shown, other electrical or optical connections are made to the components within the integrated circuit but are not illustrated in FIG. 22. These interconnects can include other optical waveguides or may include metallic interconnects.

In other embodiments, other types of lasers can be formed. For example, another type of laser can emit light (photons) horizontally instead of vertically. If light is emitted horizontally, the MOSFET transistor could be formed within the substrate 161, and the optical waveguide would be reconfigured, so that the laser is properly coupled (optically connected) to the transistor. In one specific embodiment, the optical waveguide can include at least a portion of the accommodating buffer layer. Other configurations are possible.

Clearly, these embodiments of integrated circuits having compound semiconductor portions and Group IV semiconductor portions, are meant to illustrate what can be done and are not intended to be exhaustive of all possibilities or to limit what can be done. There is a multiplicity of other possible combinations and embodiments. For example, the compound semiconductor portion may include light emitting diodes, photodetectors, diodes, or the like, and the Group IV semiconductor can include digital logic, memory arrays, and most structures that can be formed in conventional MOS integrated circuits. By using what is shown and described herein, it is now simpler to integrate devices that work better in compound semiconductor materials with other components that work better in Group IV semiconductor materials. This allows a device to be shrunk, the manufacturing costs to decrease, and yield and reliability to increase.

Although not illustrated, a monocrystalline Group IV wafer can be used in forming only compound semiconductor electrical components over the wafer. In this manner, the wafer is essentially a "handle" wafer used during the fabrication of the compound semiconductor electrical components within a monocrystalline compound semiconductor layer overlying the wafer. Therefore, electrical components can be formed within III–V or II–VI semiconductor materials over a wafer of at least approximately 200 millimeters in diameter and possibly at least approximately 300 millimeters.

By the use of this type of substrate, a relatively inexpensive "handle" wafer overcomes the fragile nature of the compound semiconductor wafers by placing them over a relatively more durable and easy to fabricate base material. Therefore, an integrated circuit can be formed such that all electrical components, and particularly all active electronic devices, can be formed within the compound semiconductor material even though the substrate itself may include a Group IV semiconductor material. Fabrication costs for compound semiconductor devices should decrease because larger substrates can be processed more economically and more readily, compared to the relatively smaller and more fragile, conventional compound semiconductor wafers.

Figure 23:
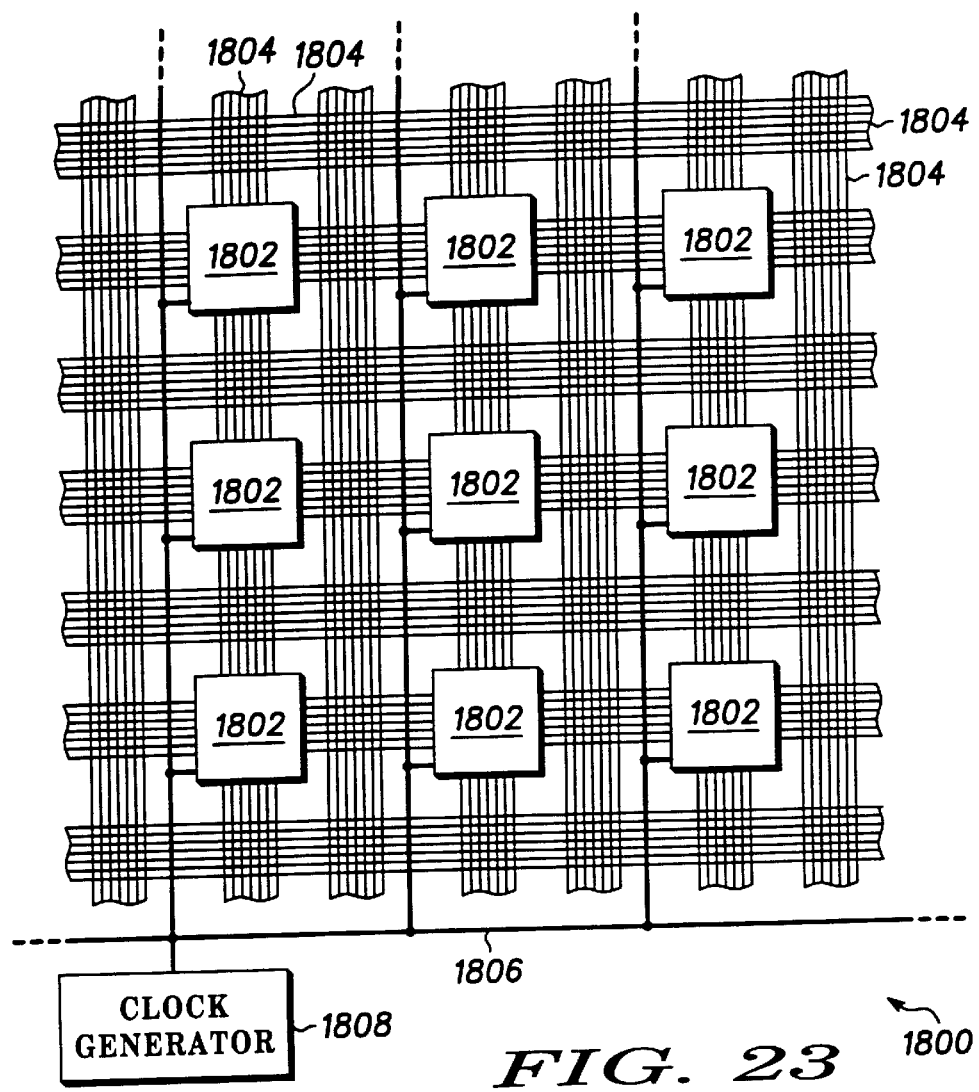
FIG. 23 is simplified plan view of a conventional semiconductor integrated circuit.

FIG. 23 represents a portion of a conventional semiconductor integrated circuit 1800, which can be a portion of a chip or an integrated wafer. Integrated circuit 1800 includes a plurality of electrical circuits 1802, data/control busses 1804, global clock wiring 1806, and optional clock generator 1808 (clock signals alternatively can be received by integrated circuit 1800 from a clock generator coupled to, but not located on, integrated circuit 1800). Fabrication of integrated circuit 1800 is typically based on a Group IV semiconductor, such as silicon or germanium. Signals on integrated circuit 1800 are generated, propagated, and processed electrically (i.e., based on signal voltage and current characteristics).

Each electrical circuit 1802 represents a circuit area of any type, size, or complexity for performing one or more data processing, memory, or logic functions of any type or complexity. For example, one or more electrical circuits 1802 can be memory arrays or digital logic (e.g., arithmetic logic units or address generation units). One or more electrical circuits 1802 can be subprocessors or system controllers of a multi-processor integrated circuit. Still other electrical circuits 1802 can be simple multiplexers, latches, or inverters. Electrical circuits 1802 can include various interconnections of transistors, diodes, capacitors, resistors, and other known electrical or electronic elements, components, or devices. Transistors can be, for example, NPN or PNP bipolar transistors or NMOS or PMOS FETs. Electrical circuits 1802 can be fabricated in any known semiconductor technology (e.g., a bipolar or CMOS technology), or combinations of known technologies (e.g., bipolar and FET technologies). Each electrical circuit 1802 has at least one input and at least one output.

Data/control busses 1804 and global clock wiring 1806 are typically metal wires fabricated on one or more wiring planes. Global clock wiring 1806 propagates clock signals to electrical circuits 1802, while busses 1804 propagate data and control signals from any electrical circuit 1802 to any other electrical circuit 1802. Intersecting busses 1804 are electively interconnected to enable data and control signals to be propagated to and from each electrical circuit 1802. Similarly, global clock signals may be routed through various wiring planes in order to reach each electrical circuit 1802. As shown, busses 1804 and global clock wiring 1806 typically consume large areas of integrated circuit 1800.

Figure 24:
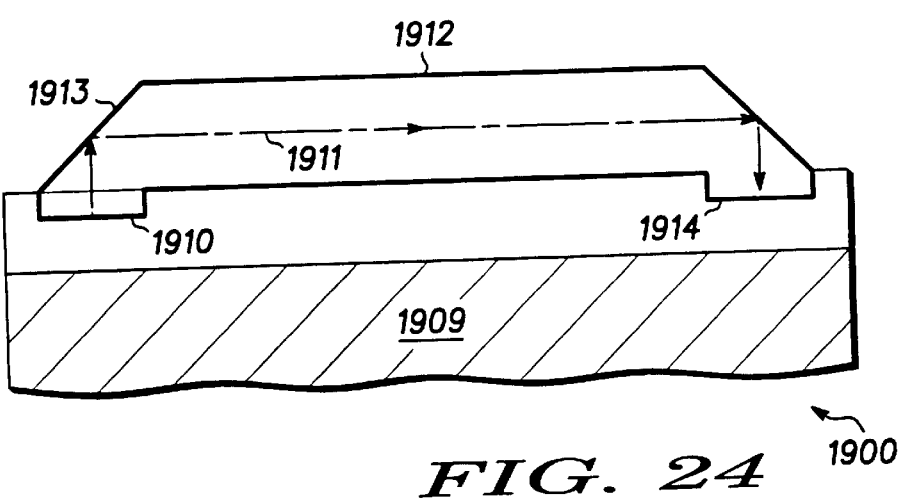
FIG. 24 is a simplified cross-sectional view of an exemplary embodiment of an optical bus in accordance with what is shown herein.

Advantageously, many long data busses and most, if not all, long global clock lines can be replaced with an optical bus 1900, an exemplary embodiment of which is shown in FIG. 24, in accordance with the present invention. (For clarity, FIG. 24 does not show the individual component layers illustrated in previous FIGS.) Optical bus 1900 is disposed on a substantially monocrystalline semiconductor substrate 1909, such as silicon, upon which multiple epitaxial layers are deposited to permit formation of active optical devices, including solid state lasers and photodetectors, in the manner described above. Optical bus 1900 preferably includes laser 1910 and includes waveguide 1912 and photodetector 1914.

Laser 1910 generates an optical signal 1911 preferably in response to an electrical signal received from, for example, an output of an electrical circuit 1802. Laser 1910 is preferably a vertical cavity surface emitting laser ("VCSEL"), which has an active area that emits laser light along an axis substantially perpendicular to the substrate surface. VCSELs can be fabricated to emit light upward, as shown in FIG. 24, or downward. If a VCSEL is fabricated to emit light downward, waveguide 1912 is fabricated before and below laser 1910. Alternatively, laser 1910 can be an edge-coupled laser. An edge-coupled laser is disposed on the surface of the substrate and has an active area that emits laser light in a plane parallel to the substrate surface.

Waveguide 1912 is a structure through which optical signals (i.e., light waves) propagate from a first location to a second location. Waveguide 1912 is made of a material that has an index of refraction different from the index of refraction of adjacent insulating material. Preferably, the waveguide material has an index of refraction greater than the index of refraction of the insulating material. This facilitates operation of the waveguide in a single optical mode. Furthermore, the waveguide preferably has cross-sectional dimensions that also facilitate operation of the waveguide in a single optical mode. As discussed above, the insulating material can be an oxide, a nitride, an oxynitride, a low-k dielectric, or any combination thereof. As also discussed above, the waveguide material can be, for example, strontium titanate, barium titanate, strontium barium titanate, or a combination thereof. As shown, for example, in FIGS. 16–22, waveguide 1912 is preferably constructed with materials having a sufficiently high index of refraction to cause substantially total internal reflection of the optical signals passing there through.

Waveguide 1912 is optically coupled to laser 1910 via an optical interconnect portion 1913 disposed above laser 1910. Optical interconnect portion 1913 includes a side wall surface that reflects laser light about 90° so that the laser is properly coupled to an end of the waveguide. The side wall can be formed according to any convenient process, such as photo-assisted etching, dep-etch processing, or preferential chemical etching.

Optical signals advantageously propagate more rapidly through a waveguide than do electrical signals through conventional electrical conductors and vias (which connect conductors on different planes). This is primarily because of the greater impedance of such conductors and vias.

Photodetector 1914 is optically coupled to waveguide 1912, and is a photosensitive element that detects and converts optical signals to electrical signals. Photodetector 1914 is preferably very sensitive, capable of detecting small optical signals, and can be, for example, a photodiode or phototransistor. Alternatively, photodetector 1914 can be any other suitable photosensitive element.

An illustrative method of fabricating optical bus 1900 on a semiconductor substrate is as follows. The substrate has a surface that at least includes a monocrystalline region above which a laser can be formed and a waveguide region (i.e., a monocrystalline, polycrystalline, or amorphous region) above which a waveguide can be formed. The method includes (1) forming an accommodating layer on the substrate; (2) forming a laser above the accommodating layer over the monocrystalline region, using at least one compound semiconductor material; (3) growing a high refractive index layer over the waveguide region; (4) etching a waveguide pattern in the high refractive index layer to form a waveguide core having a longitudinal optical path; and (5)

cladding the waveguide core with a suitable cladding material. The cladding material may have a lower index of refraction than the high refractive index layer to support total internal reflection. In the case of a VCSEL that emits light downward, the steps of forming an accommodating layer, etching, and cladding occur before the laser is formed.

As also described in detail further above, optical bus 1900 can be fabricated on an integrated circuit (such as integrated circuit 1800) preferably on top of conventional electrical circuitry. Alternatively or additionally, conventional electrical circuitry can be fabricated on top of optical bus 1900. Optical bus 1900 can therefore advantageously replace or supplement conventional data/control busses and global clock wiring. Thus, an integrated circuit either can be made smaller or can include additional circuitry in the areas made available by the replaced busses and clock wiring. Moreover, optical bus 1900 can propagate clock and control signals and large amounts data over long distances more rapidly with less power or heat dissipation than can conventional electrical conductors.

Figure 25:
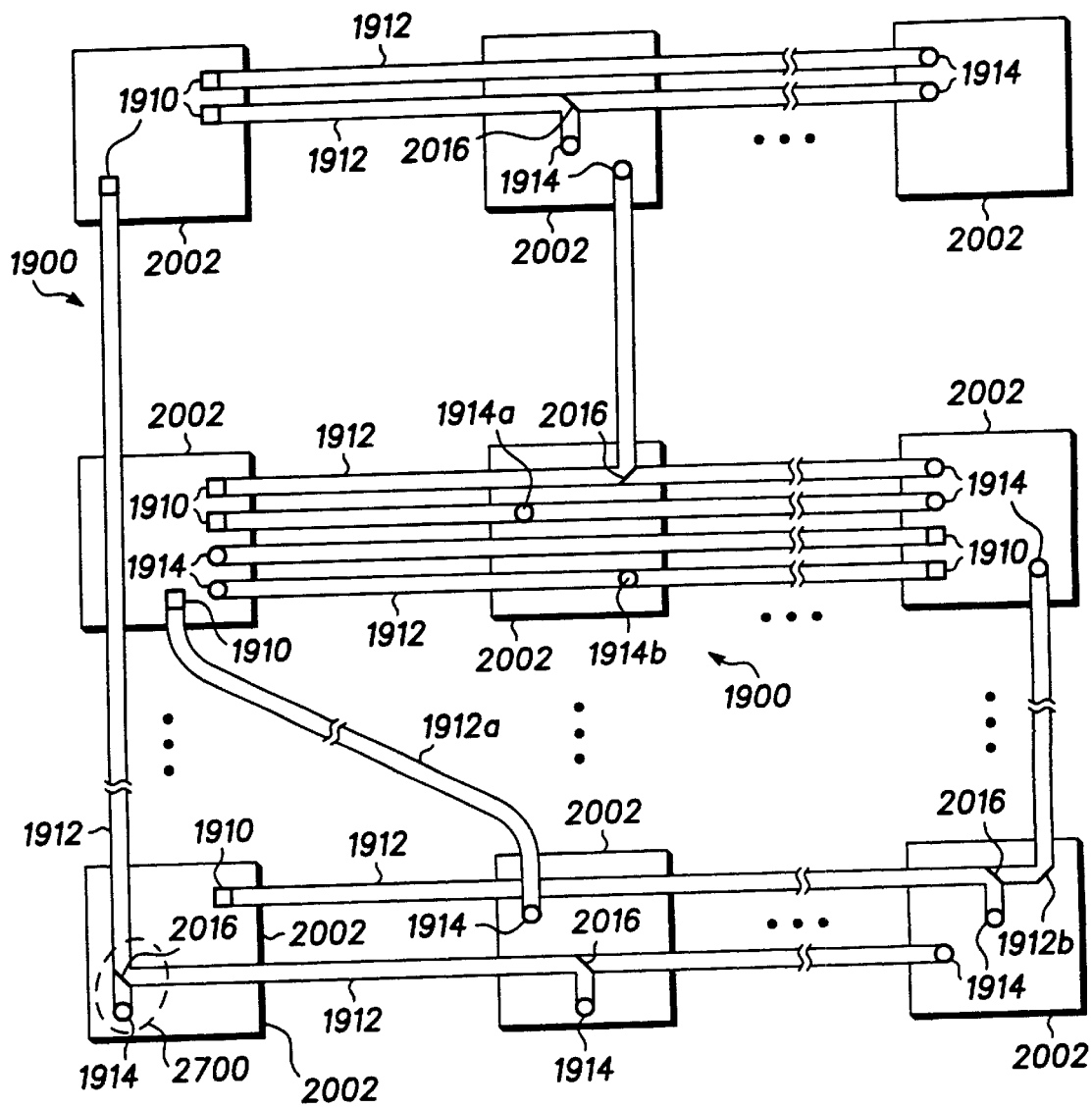
FIG. 25 is a simplified plan view of an exemplary embodiment of an integrated circuit employing the optical bus of FIG. 24 in accordance with the invention.

FIG. 25 shows a representative portion of an exemplary embodiment of integrated circuit 2000 using optical busses 1900 to replace conventional data/control busses and global clock lines in accordance with the present invention (for clarity, those busses and control lines not replaced by optical busses 1900 are not shown). Integrated circuit 2000 is preferably fabricated with both compound semiconductor portions and Group IV semiconductor portions (note that the invention is not limited to Group IV semiconductor portions), as described in more detail above. Integrated circuit 2000 is preferably a single chip or integrated wafer, and includes a plurality of Group IV-based electrical circuits 2002 (which are the same as or similar to electrical circuits 1802), a plurality of lasers 1910 (shown as small squares), a plurality of waveguides 1912, a plurality of beam splitters 2016, and a plurality of photodetectors 1914 (shown as small circles). Lasers 1910 are electrically coupled to one or more outputs of electrical circuits 2002 and are optically coupled to a waveguide 1912. Each laser 1910 is preferably controlled electronically by an electrical circuit 2002. Photodetectors 1914 are optically coupled to waveguides 1912 and are electrically coupled to one or more inputs of electrical circuits 2002.

Figure 26:
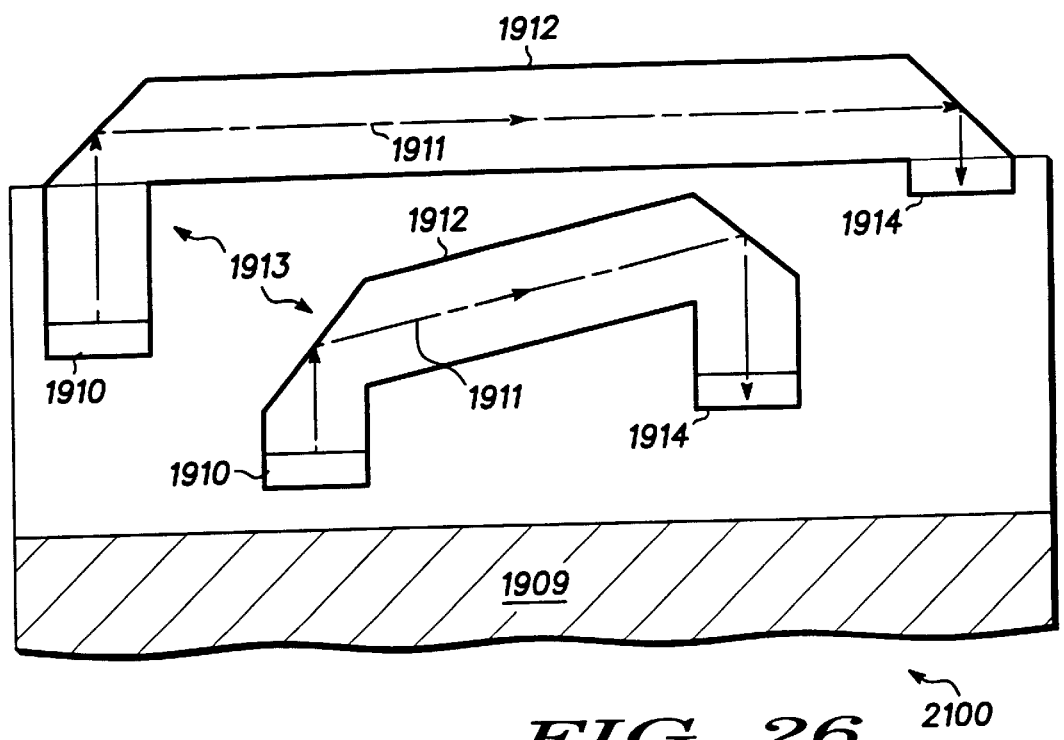
FIG. 26 is a simplified cross-sectional view of other exemplary embodiments of the optical bus of FIG. 24 in accordance with the invention.

Waveguides 1912 can be in any convenient configuration, and can include one or more straight segments, curved segments (see, e.g., waveguide 1912*a*), or combinations of both. Waveguides 1912 also can be configured to make right angle turns (see, e.g., waveguide 1912*b*). Metal or another highly reflective material can be coated on the corner chamfer to increase reflectivity, thus creating an optical path that turns at right angles and is substantially lossless. Waveguides 1912 further can be stacked on top of each other to create additional optical signal propagation planes. An insulating material can be deposited between waveguide planes. Still further, a waveguide 1912 can lie in multiple planes. Thus optical signals can be generated in one plane and detected in another. Some of these optical bus 1900 features are illustrated cross-sectionally in the optical bus embodiments of FIG. 26. (For clarity, FIG. 26 does not show the individual component layers illustrated in previous FIGS.)

Beam splatters 2016 split an optical signal into two optical signals. Alternative embodiments of beam splitters 2016 can split an optical signal into more than two optical signals. Beam splitters 2016 are placed in the optical path of waveguide 1912 regardless of the waveguide's particular geometry, and can be formed, for example, from an air gap between two parallel plates or by a partly metallized mirror. Beam splitters 2016 are optically coupled between lasers 1910 and photodetectors 1914.

Figure 27:
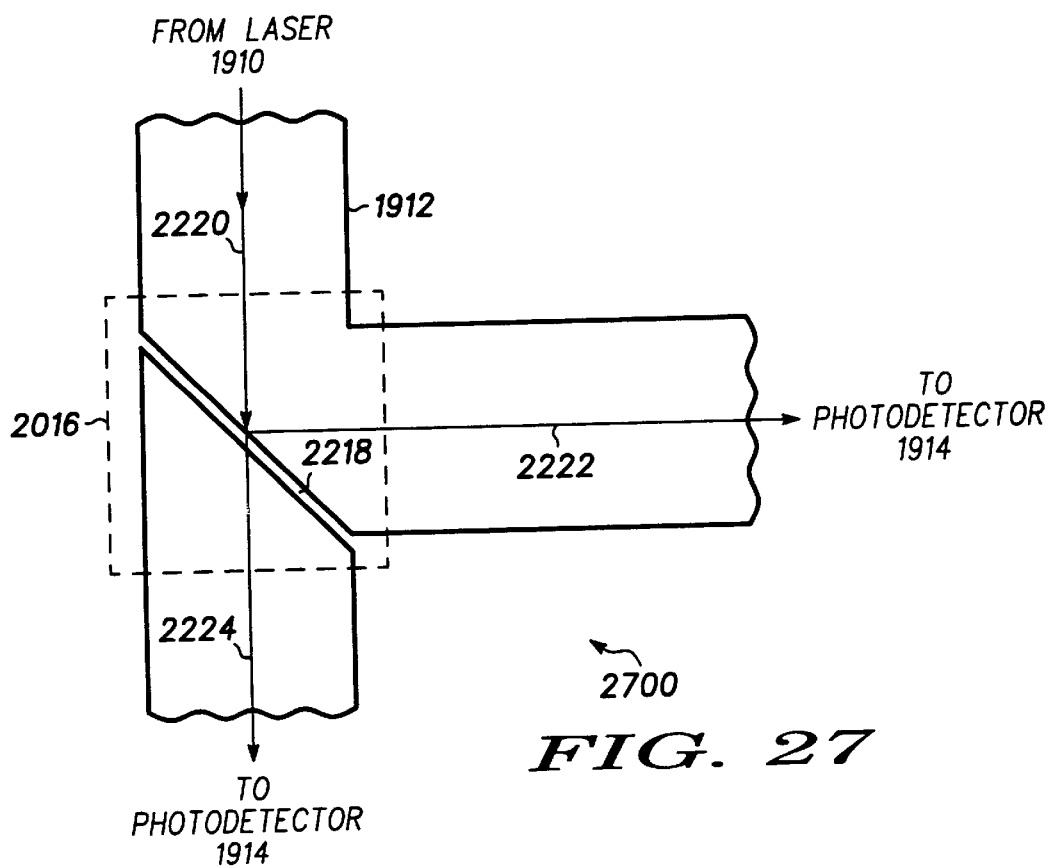
FIG. 27 is a simplified plan view of an exemplary embodiment of a beam splitter shown in FIG. 25 in accordance with the invention.

As shown more clearly in FIG. 27, beam splitter 2016 can be integral with waveguide 1912 and includes beam splitter element 2218. Element 2218 can include a thin sheet of a material that has an index of refraction different from the rest of the material of beam splitter 2106. Element 2219 is positioned in the optical path of laser beam 2220 at an angle sufficient to divert first portion 2222 of beam 2220 toward a first photodetector 1914 and second portion 2224 of beam 2220 toward a second photodetector 1914. Alternatively, beam splitter 2016 can be a separate structure optically coupled to two or more waveguides 1912.

To propagate data, clock, or control signals, an appropriate electrical signal is received by laser 1910, which preferably responds by generating an optical signal (in other words, lasers 1910 are preferably electrically modulated). The optical signal then propagates through a waveguide 1912 to one or more destinations. If a signal needs to be propagated to multiple destinations, beam splitters 2016 split the optical signal into two or more optical signals. At a signal destination, a photodetector 1914 detects and converts the optical signal to an electrical signal. Before being propagated to a receiving electrical circuit 2002, electrical signals converted by photodetectors 1914 preferably are first buffered to electrical values required by that receiving circuit 2002. If a signal destination is located under a continuing waveguide 1912, a photodetector 1914 can be coupled at that location (see, e.g., photodetectors 1914*a* and 1914*b* in FIG. 25) without significantly adversely affecting an optical signal propagating by that location, because only a fraction of the light signal will be propagating at the correct angle to couple into that photodetector 1914.

Optical busses 1900 also can be used in those integrated circuit 2000 embodiments in which a single clock generator and multiple clock drivers are replaced with simple retriggerable free running clocks located in each electrical circuit 2002. Such free running clocks merely require a periodic synchronizing signal that can be provided by a single laser 1910 coupled optically to multiple beam splitters 2016, waveguides 1912, and photodetectors 1914.

In other embodiments of the present invention, laser 1910 is not included in optical bus 1900. Instead, optical signals are generated on a separate structure by a laser or other suitable device that is appropriately coupled to a waveguide 1912. For example, some integrated circuits may receive optical data or clock signals from other integrated circuits that are part of the same interconnected system or machine. In those cases, optical bus 1900 is constructed without laser 1910 to receive and propagate such externally-generated optical signals to photodetectors 1914.

In sum, optical busses 1900 advantageously provide high-speed signal propagation that can replace significant portions of conventional metal wiring, thus freeing integrated circuit area. Optical busses 1900 that propagate clock signals advantageously eliminate the need for multiple clock drivers, thus reducing power dissipation and freeing additional integrated circuit area. Furthermore, because photodetectors 1914 are highly sensitive, optical signal losses caused by beam splitting or signal propagation through long waveguides do not adversely affect circuit performance or cause clock skewing problems.

Thus it is seen that integrated circuits with optical signal propagation are provided that rapidly propagate signals, free conventional integrated circuit area, reduce power dissipation, and substantially eliminate clock skewing problems. One skilled in the art will appreciate that the present invention can be practiced by other than the described embodiments, which are presented for purposes of illustration and not of limitation, and the present invention is limited only by the claims which follow.

Furthermore, as used herein, the terms "comprises," "comprising," or any other variation thereof, are intended to cover a non-exclusive inclusion, such that a process, method, article, or apparatus that comprises a list of elements includes not only those elements but may also include other elements not expressly listed or inherent to such process, method, article, or apparatus.

I claim:

1. An integrated circuit comprising:
    a monocrystalline silicon substrate;
    a monocrystalline perovskite oxide material overlying at least a portion of the monocrystalline silicon substrate;
    an amorphous oxide material located between the monocrystalline perovskite oxide material and the monocrystalline silicon substrate;
    a monocrystalline compound semiconductor material overlying at least a portion of the monocrystalline perovskite oxide material;
    a plurality of electrical circuits each having at least one input operable to receive an electrical signal, at least one of said electrical circuits comprising a transistor;
    a waveguide operable to propagate an optical signal selected from the group consisting of an optical data signal, an optical clock signal, and an optical control signal; and
    a photodetector operable to convert the optical signal to an electrical signal, said photodetector having an input coupled to said waveguide and an output coupled to an input of at least one of said plurality of electrical circuits, wherein at least a portion of at least one of said plurality of electrical circuits is formed within said monocrystalline silicon substrate.

2. The integrated circuit of claim 1 further comprising a laser operable to generate an optical signal, said laser having an output coupled to said waveguide.

3. The integrated circuit of claim 2 wherein:
    one of said electrical circuits has an output operable to output an electrical signal; and
    said laser has an input coupled to said electrical circuit output to receive said outputted electrical signal, said laser generating an optical signal in response to receiving said outputted electrical signal.

4. The integrated circuit according to claim 1, wherein the monocrystalline perovskite oxide material is rotated with respect to the monocrystalline silicon layer such that the lattice constant provided by the rotation of the monocrystalline perovskite oxide material substantially matches the lattice constant of the monocrystalline silicon substrate such that the effective lattice mismatch between the monocrystalline perovskite oxide material and the monocrystalline silicon substrate is no greater than about 2.0%.

5. The integrated circuit according to claim 1, wherein the monocrystalline compound semiconductor material is rotated with respect to the monocrystalline perovskite oxide material such that the lattice constant provided by the rotation of the monocrystalline compound semiconductor material substantially matches the lattice constant of the monocrystalline perovskite oxide material such that the effective lattice mismatch between the monocrystalline perovskite oxide material and the monocrystalline silicon substrate is no greater than about 2.0%.

6. The integrated circuit of claim 1 wherein said waveguide is disposed on a plane different than at least a portion of said electrical circuits.

7. The integrated circuit of claim 1 wherein said photodetector comprises a device selected from the group consisting of a photodiode and a phototransistor.

8. The integrated circuit of claim 1 wherein said electrical circuits comprise Group IV-based semiconductors.

9. The integrated circuit of claim 1 wherein said waveguide is at least partially non-straight.

10. The integrated circuit of claim 1 wherein said waveguide lies in more than one plane.

11. The integrated circuit according to claim 1, wherein the amorphous layer is prepared by a process comprising exposing the monocrystalline silicon substrate to the elements of the monocrystalline perovskite material while varying the partial pressure of oxygen to both 1) epitaxially grow the perovskite layer, and 2) form an amorphous silicon oxide layer overlying the silicon substrate.

12. The integrated circuit according to claim 1, wherein the monocrystalline silicon substrate is oriented in the (100) direction.

13. The integrated circuit according to claim 1, wherein the amorphous material includes oxygen and silicon.

14. The integrated circuit according to claim 1, wherein the amorphous oxide material is approximately 0.5 to 5 nanometers thick.

15. The integrated circuit according to claim 1, wherein the amorphous oxide material is approximately 1.5 to 2.5 nanometers thick.

16. The integrated circuit according to claim 1, wherein the monocrystalline perovskite oxide material is $Sr_zBa_{1-z}TiO_3$, wherein z ranges from 0 to 1.

17. The integrated circuit according to claim 1, wherein the monocrystalline compound semiconductor material includes gallium and arsenic.

18. The integrated circuit according to claim 1, wherein the monocrystalline perovskite oxide is strontium titanate, the amorphous layer includes silicon and oxygen, and the monocrystalline compound semiconductor material includes gallium and arsenic.

19. An integrated circuit comprising:
    a plurality of electrical circuits each having at least one input operable to receive an electrical signal, at least one of said electrical circuits comprising a transistor;
    a waveguide operable to propagate an optical signal selected from the group consisting of an optical data signal, an optical clock signal, and an optical control signal; and
    a photodetector operable to convert an optical signal to an electrical signal, said photodetector having an input coupled to said waveguide and an output coupled to an input of one of said electrical circuits; and
    a laser operable to generate an optical signal, said laser having an output coupled to said waveguide,
    wherein said laser comprises a vertical cavity surface emitting laser.

20. An integrated circuit comprising:
    a plurality of electrical circuits each having at least one input operable to receive an electrical signal, at least one of said electrical circuits comprising a transistor;
    a waveguide operable to propagate an optical signal selected from the group consisting of an optical data signal, an optical clock signal, and an optical control signal;
    a photodetector operable to convert an optical signal to an electrical signal, said photodetector having an input coupled to said waveguide and an output coupled to an input of one of said electrical circuits; and a beam splitter disposed on the integrated circuit to receive an optical signal, said beam splitter operable to split said optical signal into two optical signals.

21. An integrated circuit comprising:

a monocrystalline silicon substrate;

a monocrystalline perovskite oxide material overlying at least a portion of the monocrystalline silicon substrate;

an amorphous oxide material located between the monocrystalline perovskite oxide material and the monocrystalline silicon substrate;

a monocrystalline compound semiconductor material overlying at least a portion of the monocrystalline perovskite oxide material;

a plurality of electrical circuits each having at least one input operable to receive an electrical signal and at least one output operable to output an electrical signal, at least one of said electrical circuits comprising a transistor;

a plurality of waveguides each operable to propagate at least one of a plurality of optical signals, said waveguides disposed on top of at least a portion of said plurality of electrical circuits, each of the plurality of optical signals selected from the group consisting of an optical data signal, an optical clock signal, and an optical control signal;

a plurality of lasers each operable to generate at least one of the plurality of optical signals in response to receiving an electrical signal, each said laser having an input coupled to an output of one of said plurality of electrical circuits and having an output coupled to one of said plurality of waveguides; and a plurality of photodetectors each operable to convert one of the plurality of optical signals to an electrical signal, each of said plurality of photodetectors having an input coupled to one of said plurality of waveguides and having an output coupled to an input of at least one of said plurality of electrical circuits, wherein at least a portion of one of said plurality of electrical circuits is formed within the monocrystalline silicon substrate.

22. The integrated circuit of claim 21 wherein at least one of said waveguides crosses over another of said waveguides.

23. The integrated circuit of claim 21 wherein one of said waveguides has a plurality of said photodetectors coupled thereto.

24. A method of signal propagation on a single integrated circuit, said method comprising:

propagating a signal optically from a first location to a second location, both locations on the single integrated circuit, wherein the single integrated circuit comprises
a monocrystalline silicon substrate;
a monocrystalline perovskite oxide material overlying at least a portion of the monocrystalline silicon substrate;
an amorphous oxide material located between the monocrystalline perovskite oxide material and the monocrystalline silicon substrate; and
a monocrystalline compound semiconductor material overlying at least a portion of the monocrystalline perovskite oxide material,
and wherein the signal is selected from the group consisting of a data signal, a clock signal, and a control signal;

converting the optically propagated signal to an electrical signal, said converting accomplished on the single integrated circuit; and receiving the electrical signal at an input of an electrical semiconductor circuit on the single integrated circuit, wherein at least a portion of the electrical semiconductor circuit is formed within said monocrystalline silicon substrate.

25. The method of claim 24 further comprising:

receiving an electrical signal from an output of an electrical semiconductor circuit; and generating an optical signal on said integrated circuit in response to said receiving an electrical signal.

26. The method of claim 24 further comprising splitting said optical signal into two optical signals on said integrated circuit.

27. The method of claim 24 wherein said propagating further comprises propagating a signal optically from a first location on a first plane to a second location on a second plane, both locations on said integrated circuit.

28. The method of claim 14 wherein said propagating further comprises propagating a signal optically from a first location to a second location via a non-straight path, both locations on said integrated circuit.

29. The method of claim 24 wherein said propagating further comprises propagating a signal optically from a first location to a second location over at least a portion of an electrical semiconductor circuit, both locations on said integrated circuit.

30. The method of claim 24 wherein said propagating further comprises propagating a signal optically from a first location to a second location below at least a portion of an electrical semiconductor circuit, both locations on said integrated circuit.

31. An integrated circuit comprising:

a plurality of electrical circuits each having at least one input operable to receive an electrical signal and at least one output operable to output an electrical signal, at least one of said electrical circuits comprising a transistor;

a plurality of waveguides each operable to propagate an optical signal, said waveguides disposed on top of at least a portion of said electrical circuits, said optical signal selected from the group consisting of an optical data signal, an optical clock signal, and an optical control signal;

a plurality of vertical cavity surface emitting laser (VCSEL), each operable to generate an optical signal in response to receiving an electrical signal, each said VCSEL having an input coupled to one of said electrical circuit outputs and having an output coupled to one of said waveguides; and a plurality of photodetectors each operable to convert an optical signal to an electrical signal, each said photodetector having an input coupled to one of said waveguides and having an output coupled to one of said electrical circuit inputs.

32. An integrated circuit comprising:

a plurality of electrical circuits each having at least one input operable to receive an electrical signal and at least one output operable to output an electrical signal, at least one of said electrical circuits comprising a transistor;

a plurality of waveguides each operable to propagate an optical signal, said waveguides disposed on top of at least a portion of said electrical circuits, said optical signal selected from the group consisting of an optical data signal, an optical clock signal, and an optical control signal;

a plurality of lasers each operable to generate an optical signal in response to receiving an electrical signal, each said laser having an input coupled to one of said electrical circuit outputs and having an output coupled to one of said waveguides; and a plurality of photodetectors each operable to convert an optical signal to an electrical signal, each said photodetector having an input coupled to one of said waveguides and having an output coupled to one of said electrical circuit inputs; and a beam splitter disposed on said integrated circuit to receive an optical signal, said beam splitter operable to split said optical signal into two optical signals.

* * * * *